United States Patent
Kwak et al.

(10) Patent No.: US 9,659,966 B2
(45) Date of Patent: May 23, 2017

(54) FLEXIBLE DISPLAY SUBSTRATE, FLEXIBLE ORGANIC LIGHT EMITTING DISPLAY DEVICE AND METHOD OF MANUFACTURING THE SAME

(71) Applicant: LG Display Co., Ltd., Seoul (KR)

(72) Inventors: Sanghyeon Kwak, Paju-si (KR); HeeSeok Yang, Ansan-si (KR); Sangcheon Youn, Seoul (KR); SeYeoul Kwon, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 25 days.

(21) Appl. No.: 14/106,173

(22) Filed: Dec. 13, 2013

(65) Prior Publication Data

US 2014/0217397 A1    Aug. 7, 2014

(30) Foreign Application Priority Data

Feb. 1, 2013 (KR) .................. 10-2013-0012032

(51) Int. Cl.
    *H01L 51/05*     (2006.01)
    *B82Y 10/00*     (2011.01)
    (Continued)

(52) U.S. Cl.
    CPC ........ *H01L 27/1218* (2013.01); *H01L 27/124* (2013.01); *H01L 27/3276* (2013.01);
    (Continued)

(58) Field of Classification Search
    CPC ............. H01L 51/0545; H01L 51/0036; H01L 51/0541; H01L 51/5012; H01L 27/1214;
    (Continued)

(56) References Cited

U.S. PATENT DOCUMENTS

2005/0280157 A1    12/2005    Roush et al.
2006/0079039 A1    4/2006    Ohtani et al.
(Continued)

FOREIGN PATENT DOCUMENTS

CN      1770405 A    5/2006
CN      101110443 A    1/2008
(Continued)

OTHER PUBLICATIONS

PCT International Search Report for PCT/KR2013/012240, Apr. 29, 2014, 3 Pages.

(Continued)

*Primary Examiner* — John C Ingham
*Assistant Examiner* — Didarul Mazumder
(74) *Attorney, Agent, or Firm* — Fenwick & West LLP

(57) ABSTRACT

A flexible display substrate, a flexible organic light emitting display device, and a method of manufacturing the same are provided. The flexible display substrate comprises a flexible substrate including a display area and a non-display area extending from the display area, and a wire formed on the flexible substrate. At least a part of the non-display area of the flexible substrate is formed in a crooked shape in a bending direction, and the wire positioned on at least a part of the non-display area of the flexible substrate includes a plurality of first wire patterns, and a second wire pattern formed on the plurality of first wire patterns and electrically connected with the plurality of first wire patterns.

27 Claims, 14 Drawing Sheets

(51) Int. Cl.
  *H01L 51/00* (2006.01)
  *H01L 51/50* (2006.01)
  *H01L 27/12* (2006.01)
  *H01L 51/56* (2006.01)
  *B82Y 30/00* (2011.01)
  *H01L 27/32* (2006.01)
  *H01L 51/52* (2006.01)

(52) U.S. Cl.
  CPC ...... *H01L 51/0097* (2013.01); *H01L 51/5246* (2013.01); *H01L 51/5253* (2013.01); *H01L 2251/5338* (2013.01); *Y02E 10/549* (2013.01)

(58) Field of Classification Search
  CPC ......... H01L 51/56; B82Y 10/00; B82Y 30/00; Y02E 10/50
  USPC ..... 257/43, 40; 438/85, 86, 104, 754, 82, 99
  See application file for complete search history.

(56) References Cited

U.S. PATENT DOCUMENTS

| | | | |
|---|---|---|---|
| 2007/0019143 A1 | 1/2007 | Chen et al. | |
| 2008/0017855 A1* | 1/2008 | Kim | G02F 1/1309 257/48 |
| 2008/0289859 A1 | 11/2008 | Mikado et al. | |
| 2009/0322979 A1* | 12/2009 | Kang | G02F 1/1333 349/58 |
| 2009/0323009 A1* | 12/2009 | Paek et al. | 349/160 |
| 2011/0024162 A1 | 2/2011 | Oikawa | |
| 2012/0033168 A1* | 2/2012 | Hwang | G02F 1/13338 349/139 |
| 2012/0049178 A1* | 3/2012 | Sugimoto | H01L 27/3258 257/40 |
| 2012/0062447 A1 | 3/2012 | Tseng et al. | |
| 2012/0162099 A1* | 6/2012 | Yoo | G06F 3/0412 345/173 |
| 2012/0181544 A1* | 7/2012 | Lee et al. | 257/72 |
| 2012/0218219 A1 | 8/2012 | Rappoport et al. | |
| 2012/0235171 A1* | 9/2012 | Kim | H01L 51/5253 257/88 |

FOREIGN PATENT DOCUMENTS

| | | |
|---|---|---|
| JP | 2009259929 A | 11/2009 |
| KR | 10-2008-0050534 A | 6/2008 |
| KR | 10-2011-0053922 A | 5/2011 |

OTHER PUBLICATIONS

Office Action for Chinese Patent Application No. CN 201380073607.6, Jun. 14, 2016, 27 Pages.
European Search Report for European Patent Application No. EP 13873337.3, Sep. 5, 2016, 8 Pages.
Second Office Action for Chinese Patent Application No. CN 201380073607.6, Jan. 12, 2017, 7 Pages.

* cited by examiner

FLEXIBLE DISPLAY SUBSTRATE, FLEXIBLE ORGANIC LIGHT EMITTING DISPLAY DEVICE AND METHOD OF MANUFACTURING THE SAME

CROSS-REFERENCE TO RELATED APPLICATION

This application claims priority to and the benefit of Korean Patent Application No. 2013-0012032, filed on Feb. 1, 2013, the disclosure of which is incorporated herein by reference in its entirety.

BACKGROUND

1. Field of the Invention

The present invention relates to a flexible display device, and more particularly, to a flexible display substrate used in a flexible display device capable of relieving stress concentrating on a wire upon bending a substrate.

2. Discussion of Related Art

Display devices used in monitors of computers, televisions (TVs), and cell phones include organic light emitting display devices (OLEDs) and plasma display panels (PDPs), both of which autonomously emit light, and liquid crystal display devices (LCDs) requiring a separate light source, etc.

Recently, flexible display devices capable of being bent or curved have gained much attention as the next-generation display device. Flexible display devices offer unique features that conventional rigid display devices do not have. Even with limited flexibility, these devices provide a slimmer form factor, lighter weight, higher durability, and most of all, the freedom of design for portable electronic devices such as cell phones and multimedia players. With enhanced flexibility, a range of revolutionary display and lighting opportunities can be created. These opportunities include new electronics products such as TVs with curvature adjustable screen as well as portable electronics with a rollable display screen.

However, many factors need to be considered for the development of next-generation flexible-display technology. In a sense, flexibility means ability to withstand strain from being bent, but many parts of the flexible display devices still face the stability issues. For example, electrodes and wires in the flexible devices are often formed with indium tin oxide (ITO). ITO, however, is brittle and therefore prone to cracking when deformed, whereas the underlying substrate is ductile and flexible. Cracking of the electrodes and wires causes spots of poor or no contact and eventual loss of functionality over large areas of the display devices, and thus is one of the major concerns in flexible display devices. Even when conductive polymers or carbon based coatings are used to form the electrodes/wires, mechanical stress (i.e., tensile/compression stresses) remains.

SUMMARY OF THE INVENTION

Embodiments relate to a flexible display substrate including a flexible substrate and a wire. The flexible substrate has a curved portion that is bent. The wire has a plurality of first wire patterns and a second wire pattern. Each of the plurality of first wire patterns is spaced apart from an adjacent first wire pattern. A second wire pattern electrically connects the plurality of first wire patterns.

In one embodiment, a thin film transistor is formed on the flexible substrate to operate a light emitting element formed on the flexible substrate based on a signal transmitted via the wire.

In one embodiment, the second wire pattern overlaps with at least a portion of each of two of the first wire patterns.

In one embodiment, the portion of each first wire pattern overlaps with the second wire pattern and is in physical contact with the second wire pattern.

In one embodiment, the second wire pattern entirely covers at least one first wire pattern.

In one embodiment, the second wire pattern is in physical contact with all of the first wire patterns.

In one embodiment, the flexible display substrate further includes additional second wire patterns. Each of the additional second wire patterns may electrically connect at least two of the first wire patterns.

In one embodiment, at least two of the additional second wire patterns have different lengths.

In one embodiment, the second wire pattern has greater flexibility than the plurality of first wire patterns.

In one embodiment, two adjacent first wire patterns are spaced apart by a predetermined distance, and the second wire pattern has a length longer than the predetermined distance.

In one embodiment, the flexible display substrate further includes an insulation layer formed between and formed on each of the plurality of first wire patterns. The second wire pattern may be disposed on the insulation layer.

In one embodiment, at least a portion of the wire in the curved portion extends in a direction that is not parallel to a bending direction of the curved portion.

In one embodiment, the second wire pattern includes a plurality of portions. At least one of the plurality of portions extending in a direction that is not parallel to a bending direction of the curved portion.

In one embodiment, the flexible display substrate includes a crack prevention layer disposed on at least one of top and bottom surfaces of the wire.

Embodiments also relate to a flexible display device including a flexible substrate and a conductive line. The flexible substrate includes a substantially flat area extending along a plane, and a bending area adjacent to the substantially flat area and bending away from the plane. The conductive line is disposed on the curved portion of the flexible substrate. The wire includes a first layer of wire segments and a second layer of wire segments electrically connecting the first layer of wire segments. At least part of the second layer formed on the first layer.

In one embodiment, the flexible display device further includes a passivation layer and a crack prevention layer. The passivation layer is formed above the conductive line at an opposite side of the flexible substrate. The crack prevention layer is placed between the passivation layer and the conductive line.

In one embodiment, the crack prevention layer includes at least one of a porous material and nanoparticles.

In one embodiment, the flexible display device further includes a display unit having an anode, a cathode, and a plurality of thin-film-transistors (TFT). Each TFT has a source electrode, a drain electrode and a gate electrode. The first layer or the second layer is formed of the same material as at least one of the anode, the cathode, the source electrode, the drain electrode and the gate electrode.

In one embodiment, the conductive line is connected to at least one of the anode, the cathode, the source electrode, the drain electrode and the gate electrode.

In one embodiment, the flexible display device further includes a separation layer interposed between the first layer of wire segments and the second layer of wire segments. The separation layer has a plurality of contact holes. The first layer is in physically contact with the second layer through the plurality of contact holes.

In one embodiment, the flexible display device further includes a buffer layer interposed between the conductive line and the flexible substrate, and a crack prevention layer interposed between the buffer layer and the conductive line.

Embodiments also relate to a method of fabricating a flexible display device. A plurality of first wire segments that are physically separated on at least a bending area of a flexible substrate are formed. A second wire segment is formed to bridge the first wire segments on at least the bending area of the flexible substrate. A display unit is formed on a flat area adjacent to the bending area, the display unit having an anode, a cathode, an organic light emitting diode between the anode and the cathode, and a plurality of thin-film-transistors (TFT). Each TFT has a source electrode, a drain electrode and a gate electrode. The first wire segments or the second wire segment are formed of the same material as any one of the anode, the cathode, the source electrode, the drain electrode and the gate electrode. The flexible substrate is bent at the bending area away from a plane along which the flat area of the flexible substrate extends.

In one embodiment, the first wire segments are formed by etching a layer of metal on the flexible substrate.

Further features of the invention, its nature and various advantages will be more apparent from the accompanying drawings and the following detailed description of the embodiments.

BRIEF DESCRIPTION OF THE DRAWINGS

The accompanying drawings, which constitute a part of this specification, illustrate various embodiments of the present invention.

DETAILED DESCRIPTION OF EXEMPLARY EMBODIMENTS

Figure 1A:
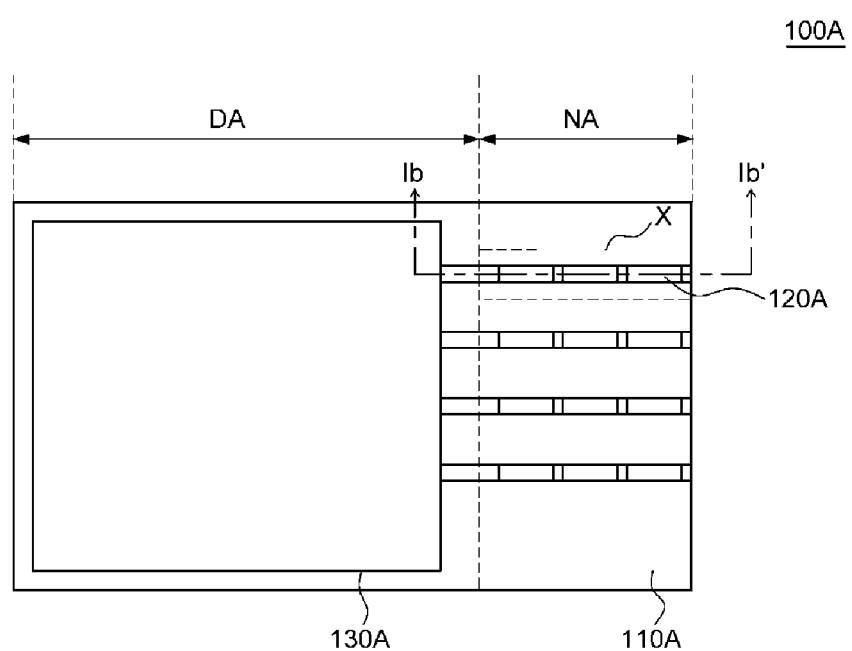
FIG. 1A is a top view showing an unbent state of a flexible display substrate according to an exemplary embodiment of the present invention.

Exemplary embodiments of the present invention will be described in detail below with reference to the accompanying drawings. It is noted that the drawings of the present application are provided for illustrative purposes only and, as such, the drawings are not drawn to scale. In the following description, numerous specific details are set forth, such as particular structures, components, materials, dimensions, processing steps and techniques, in order to provide an understanding of the various embodiments of the present disclosure. However, it will be appreciated by one of ordinary skill in the art that the various embodiments of the present disclosure may be practiced without these specific details. In other instances, well-known structures or processing steps have not been described in detail in order to avoid obscuring the present disclosure.

It will be understood that when an element as a layer, region or substrate is referred to as being "on" another element, it can be directly on the other element or intervening elements may also be present. In contrast, when an element is referred to as being "directly on" another element, there are no intervening elements present.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Further, it will be understood that when an element is referred to as being "overlapped" with another element, one element can be positioned above the other element or below the other element. Moreover, although some of the elements are designated with numerical terms (e.g., first, second, third, etc.), it should be understood that such designations are only used to specify one element from a group of similar elements, but not to limit the element in any specific order. As such, an element designated as a first element could be termed as a second element or as third element without departing from the scope of exemplary embodiments.

In this specification, an organic light emitting display device with a top emission mode refers to an organic light emitting display device, wherein light emitted from the organic light emitting diode radiates from an upper portion of the organic light emitting display device. That is, the organic light emitting display device with a top emission mode refers to an organic light emitting display device, wherein light emitted from the organic light emitting diode radiates in a direction of a top surface of a substrate having a thin film transistor formed therein for driving the organic light emitting display device.

On the other hand, an organic light emitting display device with a bottom emission mode refers to an organic light emitting display device, wherein light emitted from the organic light emitting diode radiates from a lower portion of the organic light emitting display device. That is, the organic light emitting display device with a bottom emission mode refers to an organic light emitting display device, wherein light emitted from the organic light emitting diode radiates in a direction of a bottom surface of a substrate having a thin film transistor formed therein for driving the organic light emitting display device.

Further, an organic light emitting display device with a dual emission mode refers to an organic light emitting display device, wherein light emitted from the organic light emitting diode radiates from upper and lower portions of the organic light emitting display device. A thin film transistor, an anode, and a cathode may be configured depending on the mode of emission, so that light from the light emitting element is not interfered.

In the present disclosure, a flexible display device refers to a display device endowed with flexibility, and may be used to have the same meaning as a bendable display device, a rollable display device, an unbreakable display device, or a foldable display device. In this specification, a flexible organic light emitting display device is one example of various flexible display devices.

In this specification, a transparent display device refers to a transparent display device that is at least a part of a screen of a display device viewed by a user. In this specification, transparency of the transparent display device refers to a degree of transparency at which a user at least recognizes an object behind a display device. In this specification, the transparent display device includes a display area and a non-display area. The display area is an area on which an image is displayed, and the non-display area is an area on which no image is displayed, such as a bezel area. To maximize transmittance of the display area, the transparent display device is configured to dispose opaque components, such as a battery, a printed circuit board (PCB), and a metal frame, under the non-display area rather than the display area. In this specification, the transparent display device refers to a display device having transmissivity of, for example, equal to or greater than at least 20%. In this specification, the term "transmissivity" means a value obtained by dividing an intensity of light, which passes through the transparent display device except for light which is incident on a transmissive region of the transparent display device and reflected on the interface between respective layers of the transparent display device, by an intensity of the entire incident light.

In this specification, front and rear surfaces of the transparent display device are defined based on light emitted from the transparent display device. In this specification, the front surface of the transparent display device means a surface on which light from the transparent display device is emitted, and the rear surface of the transparent display device means a surface opposite to the surface on which the light from the transparent display device is emitted.

The features of various exemplary embodiments of the present invention may be partially or entirely bound or combined with each other, and be technically engaged and driven using various methods as apparent to those skilled in the art, and the exemplary embodiments may be independently practiced alone or in combination.

Hereinafter, various exemplary embodiments of the present invention will be described in further detail with reference to the accompanying drawings.

Figure 1B:
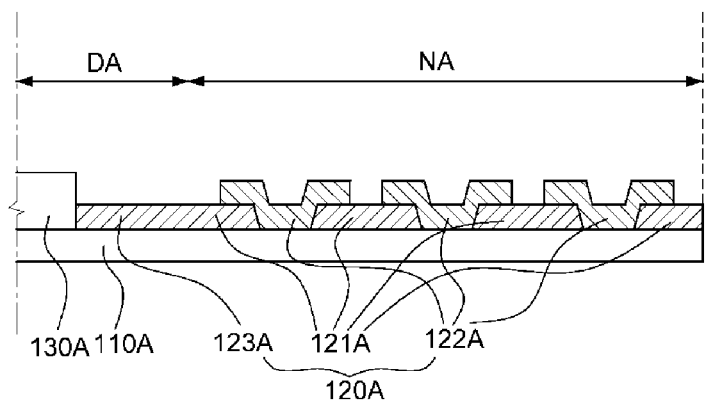
FIG. 1B is a cross-sectional view of the flexible display substrate taken along line Ib-Ib' shown in FIG. 1A.
Figure 1C:
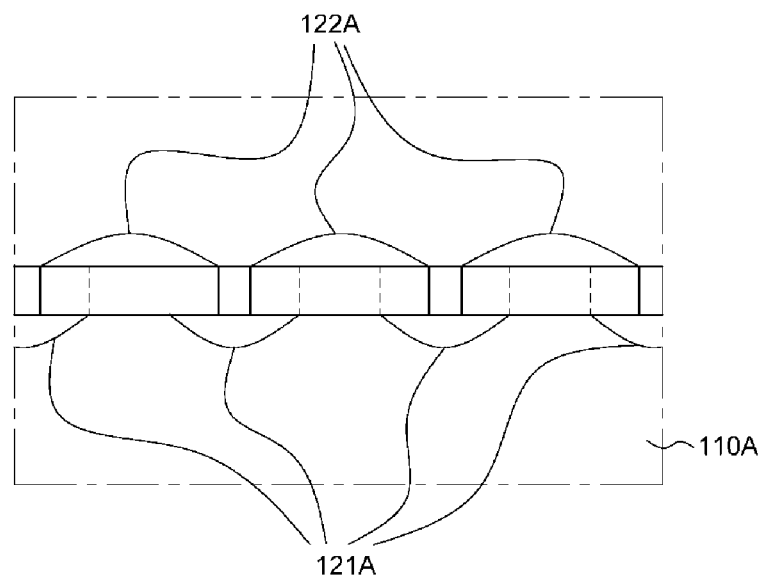
FIG. 1C is an enlarged diagram of an area X shown in FIG. 1A.
Figure 1D:
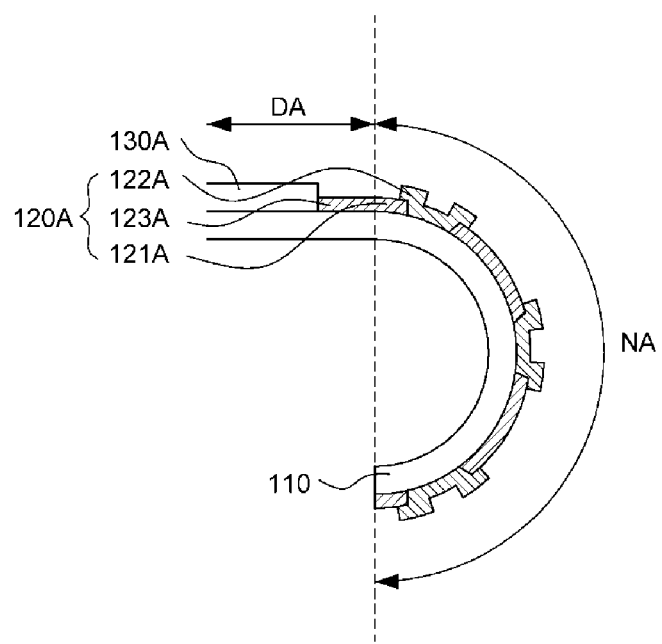
FIG. 1D is a cross-sectional view illustrating an exemplary embodiment of the invention along with a flexible display substrate in a bent state.

FIG. 1A is a top view showing an unbent state of a flexible display substrate according to one exemplary embodiment of the present invention. FIG. 1B is a cross-sectional view of the flexible display substrate taken along line Ib-Ib' shown in FIG. 1A. FIG. 1C is an enlarged diagram of an area X shown in FIG. 1A. FIG. 1D is a cross-sectional view showing a bent state of the flexible display substrate according to one exemplary embodiment of the present invention. Referring to FIGS. 1A to 1D, a flexible display substrate 100A includes a flexible substrate 110A, a wire 120A, and a display unit 130A.

The flexible substrate 110A is a substrate configured to support various components of the flexible display. Here, the flexible substrate 110A is endowed with flexibility. The flexible substrate 110A may also be referred to as a flexible substrate, a first flexible substrate, or a flexible member. When the flexible substrate 110A is formed of a plastic, the flexible substrate 110A may also be referred to as a plastic film, a plastic substrate, or a first flexible substrate. FIGS. 1A and 1B show that the flexible substrate 110A is illustrated in the form of a rectangular shape. However, it should be understood that the flexible substrate 120 may have various shapes, but the present invention is not limited thereto.

The flexible substrate 110A may be formed of a flexible material. For example, the flexible substrate 110A may be any one or more of materials including, but not limited to, a polyester-based polymer, a silicone-based polymer, an acrylic polymer, a polyolefin-based polymer, and a copolymer thereof. More particularly, the flexible substrate 110A may be formed of one or combination of materials such as polyethylene terephthalate (PET), polybutylene terephthalate (PBT), polysilane, polysiloxane, polysilazane, polycarbosilane, polyacrylate, polymethacrylate, polymethylacrylate, polyethylacrylate, polyethylmethacrylate, a cyclic olefin copolymer (COC), a cyclic olefin polymer (COP), polyethylene (PE), polypropylene (PP), polyimide (PI), polymethylmethacrylate (PMMA), polystyrene (PS), polyacetal (POM), polyether ether ketone (PEEK), polyestersulfone (PES), polytetrafluoroethylene (PTFE), polyvinylchloride (PVC), polycarbonate (PC), polyvinylidenefluoride (PVDF), a perfluoroalkyl polymer (PFA), a styrene acrylonitrile copolymer (SAN), and a combination thereof. The material of flexible substrate 110A is not limited to the above, but it can be formed of various other transparent flexible material based on the application of the flexible display substrate 100A as well as the type of flexible display device employing the display substrate 110A.

The flexible substrate 110A includes a display area DA and a non-display area NA. The display area DA of the flexible substrate 110A refers to an area on which an image is actually displayed, and the non-display area NA of the flexible substrate 110A refers to an area on which no image is displayed.

The non-display area NA of the flexible substrate 110A is an area extending from the display area DA of the flexible substrate 110A. The non-display area NA of the flexible substrate 110A extends from one side of the display area DA of the flexible substrate 110A. For example, the display area DA of the flexible substrate 110A may be formed in a polygonal shape, and the non-display area NA of the flexible substrate 110A may extend from one side of the display area DA of the flexible substrate 110A. For the sake of convenience of description, FIGS. 1A to 1D show that the non-display area NA of the flexible substrate 110A extends from one side of the display area DA of the flexible substrate 110A, but the present invention is not limited thereto. For example, the non-display areas NA of the flexible substrate 110A may extend from a plurality of sides of the display area DA of the flexible substrate 110A.

The non-display area NA of the flexible substrate 110A is positioned at a peripheral or edge portion of the display area DA of the flexible substrate 110A, and various circuits for displaying an image are disposed on the non-display area NA of the flexible substrate 110A. Therefore, the non-display area NA of the flexible substrate 110A may also be referred to as a peripheral area, a peripheral circuit area, an edge area, or a bezel area.

A display unit 130A is disposed at all or part of the display area DA of the flexible substrate 110A. The display unit 130A is an element configured to actually display an image, and may also be referred to as an image display unit or a display panel. The display unit 130A may be used without limitation as long as it can be configured to display an image. In this specification, however, the display unit 130A that is an organic light emitting diode in which an image is displayed through an organic light emitting layer will be described.

Various elements on which no image is displayed may be disposed at the non-display area NA of the flexible substrate 110A. The elements disposed at the non-display area NA of the flexible substrate 110A may include various ICs such as gate driver ICs or data driver ICs, and drive circuit units. Here, the various ICs and drive circuit units may be embedded in the flexible substrate 110A using a gate-in-panel (GIP) method, or be connected to the flexible substrate 110A using a tape-carrier-package (TCP) or chip-on-film (COF) method.

The flexible substrate 110A includes a substantially flat area, which extends in a plane. The flexible substrate 110A further includes a bending area curved in a bending direction such that it is bending away from the plane. Accordingly, some parts of the display area or non-display area NA of the flexible substrate 110A may include a curved portion in the bending direction, which may be referred to as a bending area. Since the non-display area NA of the flexible substrate 110A is not an area on which an image is displayed, an image does not need to be viewed from a top surface of the flexible substrate 110A, and at least a part of the non-display area NA of the flexible substrate 110A may be bent. For the sake of convenience of description, FIGS. 1A to 1D illustrate non-display area NA of the flexible substrate 110A being the bending area BA, but it should be appreciated that the present invention is applicable to any area of the flexible display substrate. For example, only a part of the non-display area NA of the flexible substrate 110A may correspond to the bending area. For the sake of convenience of description, FIG. 1A shows that the non-display area NA of the flexible substrate 110A is slightly narrower than the display area DA of the flexible substrate 110A. However, the non-display area NA of the flexible substrate 110A may actually correspond to an area much narrower than the display area DA of the flexible substrate 110A.

The bending area that is at least a part of the non-display area NA of the flexible substrate 110A is formed in a curved shape in a bending direction. FIGS. 1A to 1D show that the bending direction is a horizontal direction of the flexible substrate 110A, and the bending area that is at least a part of the non-display area NA of the flexible substrate 110A is bent in a horizontal direction of the flexible substrate 110A.

A wire 120A is formed on the flexible substrate 110A. The wire 120A may electrically connect a display unit 130A, which may be formed on the display area DA of the flexible substrate 110A, with a drive circuit unit, a gate driver IC, or a data driver IC, which may be formed on the non-display area NA of the flexible substrate 110A, to send a signal. The wire 120A includes a plurality of first wire patterns 121A disposed on at least a part of the non-display area NA of the flexible substrate 110A and a second wire pattern 122A disposed on at least a part of the non-display area NA of the flexible substrate 110A, in which the second wire pattern 122A is configured to electrically connect at least two of the plurality of first wire patterns 121A.

The wire 120A (i.e., the plurality of first wire patterns 121A and at least one second wire pattern 122A) is formed of one or more conductive materials. It is preferred that the wire 120A is formed of conductive materials, such as gold (Au), silver (Ag) and aluminum (Al), having excellent flexibility so as to minimize generation of cracks upon bending the flexible substrate 110A. However, the constituent material of the wire 120A is not particularly limited, and may be formed with one of various conductive materials used in other components/parts of the display unit 130A. For instance, the wire 120A (i.e., the plurality of first wire patterns 121A and at least one second wire pattern 122A) may be formed of one of various materials used to manufacture the display unit 130A, such as molybdenum (Mo), chromium (Cr), titanium (Ti), nickel (Ni), neodymium (Nd), copper (Cu), and an alloy of silver (Ag) with magnesium (Mg). Also, the wire 120A (i.e., the first wire patterns 121A and the second wire pattern 122A) may be formed in a multi-layer structure including the various conductive materials as described above. For example, the wire 120A may be formed in a three-layer structure of titanium (Ti), aluminum (Al), and titanium (Ti), but the present invention is not limited thereto. It is sufficient that the first and second wire patterns are formed of conductive material. Accordingly, in the present disclosure, the term "wire pattern" may be referred to as a metal pattern or a conductive pattern.

In the example shown in FIGS. 1A-1D, the wire 120A includes a plurality of first wire patterns 121A formed on at least a part of the non-display area NA of the flexible substrate 110A, a second wire pattern 122A formed on at least a part of the non-display area NA of the flexible substrate 110A and electrically connected with the plurality of first wire patterns 121A, and a third wire pattern 123A formed on the display area DA of the flexible substrate 110A and coming in contact with the plurality of first wire patterns 121A or the second wire pattern 122A.

In the present disclosure, the third wire pattern 123A refers to a pattern formed in the wire 120A at the display area DA of the flexible substrate 110A. For clearer explanation, the third wire pattern 123A is illustrated as a separate wire pattern. However, it should be noted that the third wire pattern 123A can be one of the first wire pattern 121A having one end electrically connected with the display unit 130A and the other end electrically connected to another first wire pattern 121A via the second wire pattern 122A. Likewise, the third wire pattern 123A can also be a second wire pattern 122A having one of its end electrically connected with the display unit 130A and the other end electrically connected to one of the first wire patterns 121A. Accordingly, in FIG. 1B, one end of the third wire pattern 123A comes in contact with the plurality of first wire patterns 121A. In some other embodiments, however, the third wire pattern 123A may come in contact with the second wire pattern 122A.

The third wire pattern 123A may be formed of the same material as the plurality of first wire patterns 121A and/or the second wire pattern 122A. Also, the third wire pattern 123A may be formed of the same material as one of the conductive materials used to form the display unit 130A, and may be formed of a conductive material different from the conductive material used to form the display unit 130A. In embodiments where the third wire pattern 123A is not a part of the first wire patterns 121A or the second wire pattern 122A, the third wire pattern 123A can be formed of a material different from the plurality of first wire patterns 121A and the second wire pattern 122A.

The plurality of first wire patterns 121A is formed on the non-display area NA of the flexible substrate 110A. The plurality of first wire patterns 121A is discontinuously formed on the flexible substrate 110A, and is in the form of an island. In other words, each of the first wire patterns 121A is spaced apart from its adjacent first wire pattern 121A by a predetermined distance. The plurality of first wire patterns 121A may be formed at the same time with the same material, and may also be formed at the same time as the third wire pattern 123A connected with a component in the DA. In some exemplary embodiments, may be formed of the same material as one of the conductive materials used to form the display unit 130A. As mentioned above, the third wire pattern 123A may be part of the first wire pattern 121A.

The second wire pattern 122A is formed on the first wire patterns 121A at the non-display area NA of the flexible substrate 110A, and electrically connected with the first wire patterns 121A. As shown in FIG. 1B, some embodiments of the wire 120A includes multiple second wire patterns 122A that are separated from each other. Each of the second wire pattern 122A is formed on some portion of the first wire patterns 121A being electrically connected via the second wire pattern 122A so that the portion of each first wire patterns 121A overlapping with the second wire pattern 122A is in physical contact with the second wire pattern 122A. Therefore, the plurality of first wire patterns 121A and the plurality of second wire patterns 122A jointly form a wire 120A. Since each of the plurality of second wire patterns 122A is electrically connects at least two first wire patterns 121A, the second wire patterns 122A may be longer/shorter than the first wire pattern 121A, depending on the distance between the first wire patterns 121A. In some embodiments, the second wire pattern 122A may be formed of the same material as one of the components disposed in the display area.

Generally, the longer the wire, the greater the tensile stress applied to the wire. Accordingly, a wire electrically connecting two points can be formed with multiple conductive patterns in such a way that the conductive patterns are electrically connected with each other to provide electrical channel between two points. In this configuration, the tensile stress is distributed to the conductive patterns forming the wire. Since each of the conductive patterns forming the wire is shorter than the original wire (e.g., single wire extending between the two points), each conductive pattern receives less tensile stress. As a result, the chance of wire being cracked or disconnected is greatly reduced. Even when the distance between the two points increases, additional number of conductive patterns can be used to cover the distance without increasing the chance wire breakage.

Figure 1E:
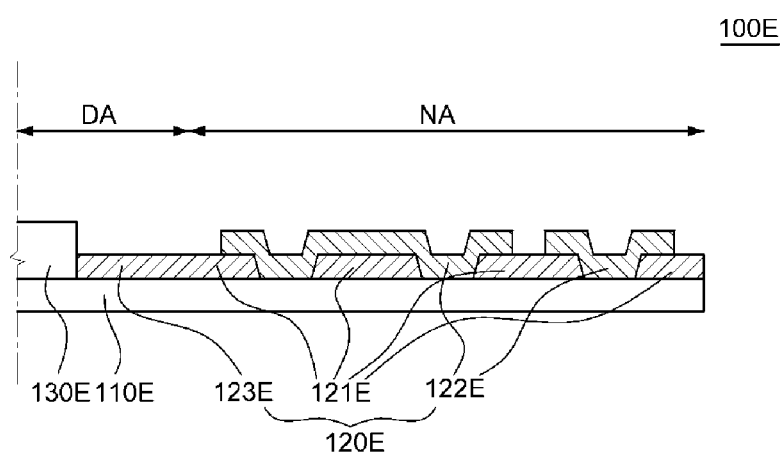
FIGS. 1E and 1F are cross-sectional views of the flexible display substrates according to various exemplary embodiments of the present invention.
Figure 1F:
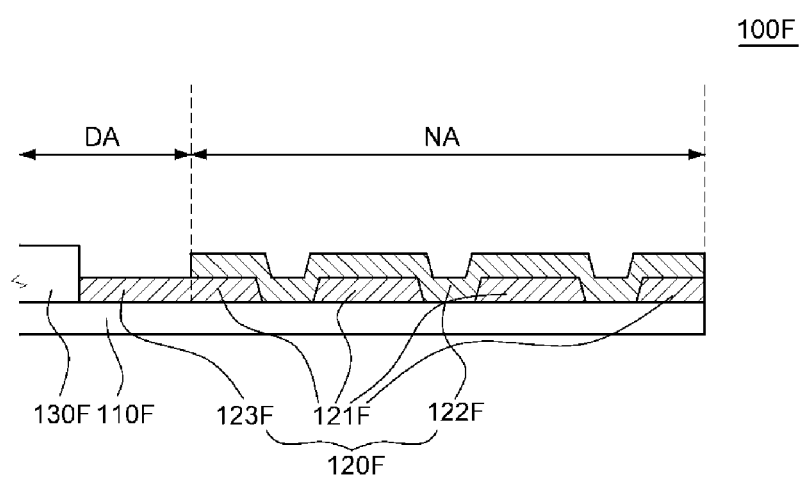

FIGS. 1E and 1F are cross-sectional views of the flexible display substrates according to various exemplary embodiments of the present invention. A flexible substrate 110E, a wire 120E, and a display unit 130E shown in FIG. 1E are substantially identical to the flexible substrate 110A, the wire 120A, and the display unit 130A shown in FIG. 1A, and a flexible substrate 110F, a wire 120F, and a display unit 130F shown in FIG. 1F are substantially identical to the flexible substrate 110A, the wire 120A, and the display unit 130A, and thus repeated description of the same elements as shown in FIGS. 1E and 1F is omitted for brevity.

As shown in FIGS. 1E and 1F, lengths of second wire patterns 122E and 122F may be greater than those of a plurality of first wire patterns 121E and 121F.

Referring to FIG. 1E, the second wire pattern 122E may be in the form of an island, and the second wire pattern 122E in the form of an island may be formed on parts of surfaces of the plurality of first wire patterns 121E so that parts of surfaces of the plurality of first wire patterns 121E can come in contact with a part of a surface of the second wire pattern 122E. As shown, some of the first wire patterns 121E may be entirely overlapped by the second wire pattern 122E. In other words, some of the plurality of second wire patterns 122E may come in contact with two or more first wire patterns 121E among the plurality of first wire patterns 121E. For example, one of the second wire patterns 122E may come in contact with three first wire patterns 121E, and the other one of the second wire patterns 122E may come in contact with two first wire patterns 121E, as shown in FIG. 1E. Accordingly, the length of the second wire pattern 122E may be greater than the length of each of the plurality of first wire patterns 121E.

A material constituting the second wire pattern 122E may have a higher flexibility than a material constituting the plurality of first wire patterns 121E. As described above, a greater tensile force is applied to the longer wire. Also, the amount of mechanical stress varies depending on the position of the wire patterns. For instance, wire patterns disposed on the outer side of the curvature receives more tensile stress than the wire patterns disposed in the inner side of the curvature. As such, a greater tensile force is applied to the second wire pattern 122E having a greater length, compared with the plurality of first wire patterns 121E. Accordingly, the second wire pattern 122E can be formed with a material having greater flexibility than the first wire patterns 121E when the second wire pattern 122E formed to be longer than the first wire patterns 121E.

Referring to FIG. 1F, the second wire pattern 122F may be in the form of a line, and the second wire pattern 122F in the form of a line may be formed on parts of surfaces of a plurality of first wire patterns 121F so that each of the plurality of first wire patterns 121F comes in contact with a part of a surface of the second wire pattern 122F. Therefore, the second wire pattern 122F may electrically connect at least all of the plurality of first wire patterns 121F on the curved portion of the flexible substrate. In this case, the second wire pattern 122F has greater length than each of the plurality of first wire patterns 121F.

A material constituting the second wire pattern 122F may have greater flexibility than a material constituting the plurality of first wire patterns 121F. As described above, as the wire 120F formed on the bending area at the flexible substrate 110F increases in length, a greater tensile force is applied to the wire 120F. As a result, a greater tensile force is applied to the second wire pattern 122F having a greater length, compared with the plurality of first wire patterns 121F. Accordingly, in a flexible display substrate 100F according to still another exemplary embodiment of the present invention, a material constituting the second wire pattern 122F having a greater length may have greater flexibility than a material constituting the plurality of first patterns.

Figure 1G:
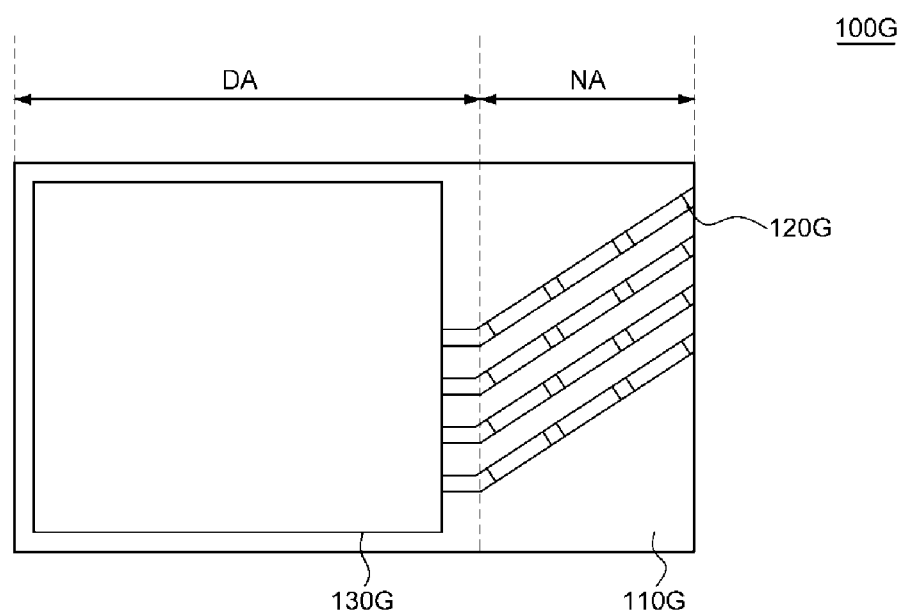
FIG. 1G is a top view showing an unbent state of the flexible display substrate according to another exemplary embodiment of the present invention.

FIG. 1G is a top view showing an unbent state of the flexible display substrate according to still another exemplary embodiment of the present invention. Referring to FIG. 1G, a flexible display substrate 100G includes a flexible substrate 110G, a wire 120G, and a display unit 130G. The flexible substrate 110G and the display unit 130G are substantially identical to the flexible substrate 110A and the display unit 130A shown in FIGS. 1A to 1D, and thus repeated description of the flexible substrate 110G and the display unit 130G is omitted for brevity.

The wire 120G is formed on the flexible substrate 110G. A part of the wire 120G positioned on at least a part of the non-display area NA of the flexible substrate 110G is formed in an oblique direction. As described above, since it is shown that the entire non-display area NA of the flexible substrate 110G corresponds to the bending area, a part of the wire 120G positioned on the non-display area NA of the flexible substrate 110G is formed in an oblique direction. In this specification, the term "oblique direction" refers to a direction which is neither parallel with a bending direction nor perpendicular to the bending direction. Since the bending direction refers to a horizontal direction of the flexible substrate 110G as shown in FIG. 1G, the oblique direction means a direction which is neither parallel with the horizontal direction of the flexible substrate 110G nor perpendicular to the horizontal direction of the flexible substrate 110G. For the sake of convenience of description, FIG. 1G shows that all the wires 120G formed on the non-display area NA of the flexible substrate 110G are formed in an oblique direction, but the present invention is not limited thereto. For example, some of the wires 120G formed on the non-display area NA of the flexible substrate 110G may be formed in an oblique direction.

When the flexible substrate is bent in a bending direction, the tensile stress is applied to the wires formed on the flexible substrate. In particular, among the wires formed on the flexible substrate, the greatest tensile force is applied to the wires extending in the same direction as the bending direction, thereby causing breaking of the wires. Therefore, in the flexible display substrate 100G according to another exemplary embodiment of the present invention, the wires 120G are not formed on the bending area of the flexible substrate 110G to extend in a bending direction, but at least parts of the wires 120G may be formed to extend in an oblique direction which is different from the bending direction, thereby reducing the tensile stress applied to the wires 120G and minimizing breaking of the wires 120G as well. The wire 120G is substantially identical to the wire 120A shown in FIGS. 1A to 1D, except that the wire 120G is formed in an oblique direction, and thus repeated description of the wire 120G is omitted for brevity.

The wires 120G formed on the non-display area NA of the flexible substrate 110G may be formed in various shapes. For example, the plurality of wires 120G positioned on the non-display area NA of the flexible substrate 110G may be formed in a trapezoidal wave shape, and also formed in various shapes such as a chopping wave shape, a sawtooth wave shape, a sine wave shape, an omega (Ω) shape, and a lozenge shape. Also, the shape of the wires 120G may be determined based on the bending direction of the non-display area NA of the flexible substrate 110G, the width of the non-display area NA, the radius of curvature of the non-display area NA, the widths of the wires 120G, and the total length of the wires 120G.

Figure 1H:
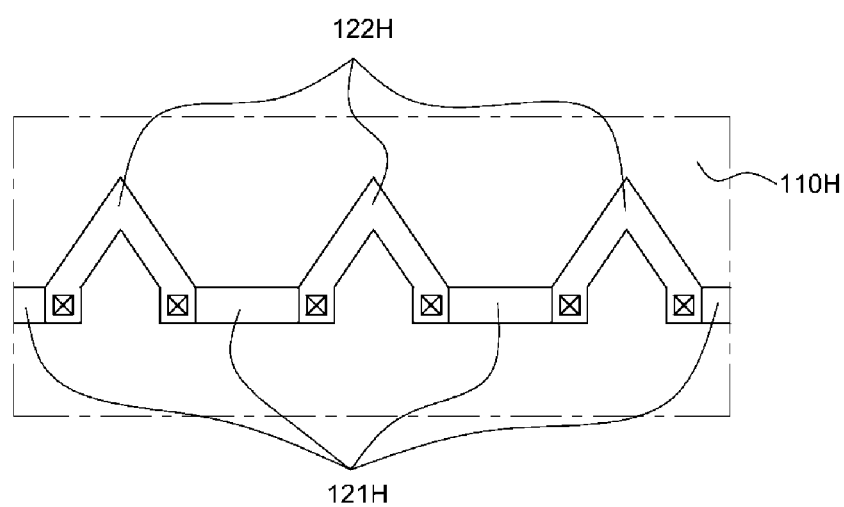
FIG. 1H is an enlarged diagram of the flexible display substrate according to an exemplary embodiment of the present invention.

FIG. 1H is an enlarged diagram of the flexible display substrate according to still another exemplary embodiment of the present invention. FIG. 1H is a planar enlarged diagram showing a wire 120H formed on a non-display area NA of a flexible substrate 110H according to still another exemplary embodiment of the present invention.

The wire 120H is formed on the flexible substrate 110H. The wire 120H includes a plurality of first wire patterns 121H formed on at least a part of the non-display area NA of the flexible substrate 110H, and a second wire pattern 122H formed on at least a part of the non-display area NA of the flexible substrate 110H and electrically connected with the plurality of first wire patterns 121H. As shown in FIG. 1H, when the second wire pattern 122H is in the form of a plurality of wire patterns, the second wire pattern 122H may be in the form of an island.

The plurality of first wire patterns 121H and the second wire pattern 122H may extend in different directions. For example, the plurality of first wire patterns 121H may be formed in a bending direction of the flexible substrate 110H, and the second wire pattern 122H may be formed in a direction different from the bending direction of the flexible substrate 110H, as shown in FIG. 1H. More particularly, since the bending direction is a horizontal direction of the flexible substrate 110H, the plurality of first wire patterns 121H may extend in a horizontal direction of the flexible substrate 110H, and the second wire pattern 122H may extend in an oblique direction rather than the horizontal direction of the flexible substrate 110H, as described above. For the sake of convenience of description, FIG. 1H shows that the second wire pattern 122H is formed in a chopping wave shape, but the present invention is not limited thereto. In some embodiments, the first wire patterns 121H may extend in the oblique direction. Also, the wire patterns may be formed in various shapes such as a sawtooth wave shape and a sine wave shape.

In some exemplary embodiments, one wire pattern may include a plurality of portions extending in two different directions. For example, the second wire pattern 122H may be divided into two parts, each of which extends from one end of one first wire pattern 121H, in different directions, and the two divided parts of the second wire pattern 122H may be coupled to one end of one first wire pattern 121H which is electrically connected with another first wire pattern 121H by means of the second wire pattern 122H. In this case, the second wire pattern 122H may be, for example, formed in various shapes such as a lozenge shape and a circular shape.

In some exemplary embodiments, the second wire pattern 122H may also be formed in a bending direction, and the plurality of first wire patterns 121H may be formed in a direction different from the bending direction. In some exemplary embodiments, both the plurality of first wire patterns 121H and the second wire pattern 122H may be formed in a direction different from the bending direction. The wire 120H is substantially identical to the wire 120A shown in FIGS. 1A to 1D except for extension directions of the plurality of first wire patterns 121H and the second wire pattern 122H, and thus repeated description of the wire 120H is omitted for brevity.

Figure 1I:
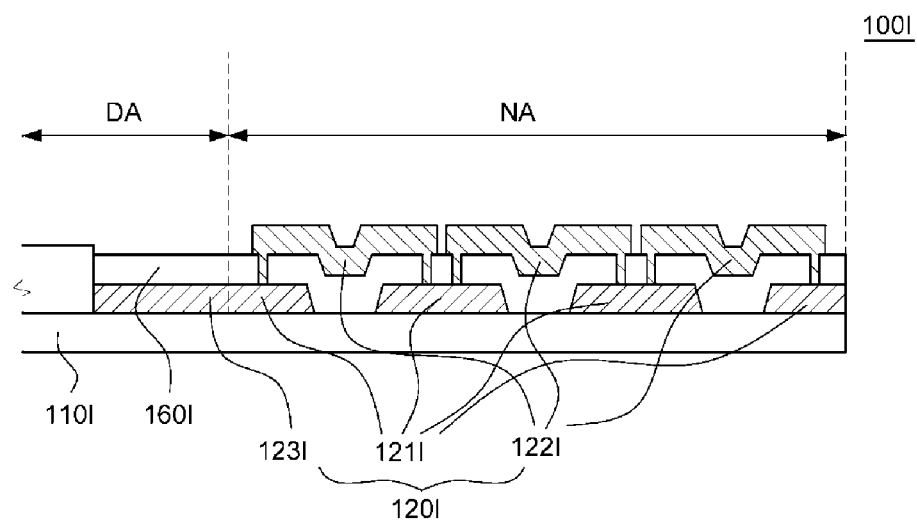
FIG. 1I is a cross-sectional view of the flexible display substrate according to an exemplary embodiment of the present invention.

FIG. 1I is a cross-sectional view of a flexible display substrate according to yet another exemplary embodiment of the present invention. Referring to FIG. 1I, a flexible display substrate 100I includes a flexible substrate 110I, a wire 120I, a separation layer 160I, and a display unit 130I. The flexible substrate 110I and the display unit 130I are substantially identical to the flexible substrate 110A and the display unit 130A shown in FIGS. 1A to 1D, and thus repeated description of the flexible substrate 110I and the display unit 130I is omitted for brevity.

The wire 120I is formed on the flexible substrate 110I. The wire 120I includes a plurality of first wire patterns 121I formed on at least a part of a non-display area NA of the flexible substrate 110I, a second wire pattern 122I formed on at least a part of the non-display area NA of the flexible substrate 110I and electrically connected with the plurality of first wire patterns 121I, and a third wire pattern 123I formed on a display area DA of the flexible substrate 110I and coming in contact with the plurality of first wire patterns 121I or the second wire pattern 122I. The plurality of first wire patterns 121I and the third wire pattern 123I are substantially identical to the plurality of first wire patterns 121A and the third wire pattern 123A shown in FIGS. 1A to 1D, and thus repeated description of the plurality of first wire patterns 121I and the third wire pattern 123I is omitted for brevity.

The separation layer 160I is formed on the plurality of first wire patterns 121I and/or the third wire pattern 123I. The separation layer 160I may be formed of an insulation material, and also be formed of the same material as one of the insulation materials used to form the display unit 130I. The separation layer 160I may include a contact hole configured to open a part of each of the plurality of first wire patterns 121I and/or the third wire pattern 123I, and the second wire pattern 122I may be formed on the separation layer 160I to come in contact with the plurality of first wire patterns 121I through the contact hole formed in the separation layer 160I. The second wire pattern 122I is substantially identical to the second wire pattern 122A shown in FIGS. 1A to 1D, except that the second wire pattern 122I comes in contact with the plurality of first wire patterns 121I through the contact hole formed in the separation layer 160I, and thus repeated description of the second wire pattern 122I is omitted for brevity.

Figure 2A:
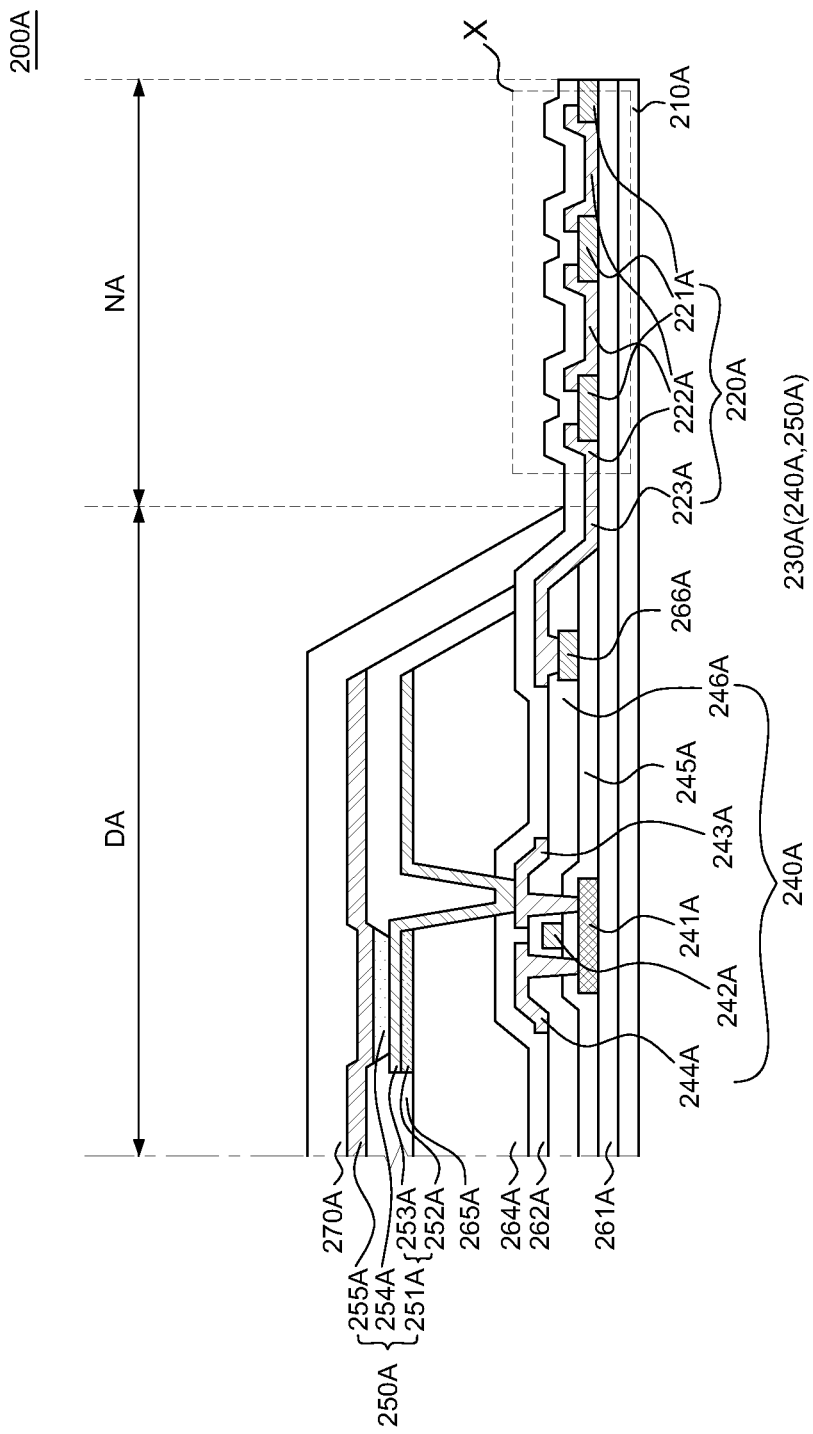
FIGS. 2A to 2C are cross-sectional views showing unbent states of flexible organic light emitting display devices according to various exemplary embodiments of the present invention.

FIG. 2A is a cross-sectional view showing an unbent state of the flexible organic light emitting display device according to one exemplary embodiment of the present invention. Referring to FIG. 2A, a flexible organic light emitting display device 200A includes a flexible substrate 210A, a wire 220A, and a display unit 230A.

The flexible substrate 210A is a substrate configured to support various elements of the flexible organic light emitting display device 200A. Here, the flexible substrate 210A is endowed with flexibility. The flexible substrate 210A may be referred to as a flexible substrate, a first flexible substrate, or a flexible member. When the flexible substrate 210A is formed of a plastic, the flexible substrate 210A may also be referred to as a plastic film or a plastic substrate.

Since a non-display area NA of the flexible substrate 210A is positioned on a peripheral or edge portion of a display area DA of the flexible substrate 210A and various circuits are disposed to display an image, the non-display area NA of the flexible substrate 210A may also be referred to as a peripheral area, a peripheral circuit area, an edge area, or a bezel area.

The non-display area NA of the flexible substrate 210A includes a bending area. For the sake of convenience of description, FIG. 2A shows that the entire non-display area NA of the flexible substrate 210A corresponds to the bending area. However, only a part of the non-display area NA of the flexible substrate 210A may correspond to the bending area. For the sake of convenience of description, FIG. 2A shows that the flexible substrate 210A is in an unbent state. However, the bending area, that is, a non-display area NA of the flexible substrate 210A may be curved in a bending direction, as shown in FIG. 1D.

The wire 220A is formed on the flexible substrate 210A. The wire 220A may electrically connect a display unit 230A, which may be formed on the display area DA of the flexible substrate 210A, with a drive circuit unit, a gate driver IC, or a data driver IC, which may be formed on the non-display area NA of the flexible substrate 210A, to send a signal. The wire 220A may be formed of a conductive material. In particular, the wire 220A may be formed of a conductive material having excellent flexibility so as to minimize generation of cracks upon bending the flexible substrate 210A. It is preferred that the wire 220A is formed of conductive materials, such as gold (Au), silver (Ag) and aluminum (Al), having excellent flexibility so as to minimize generation of cracks upon bending the flexible substrate 210A. However, the constituent material of the wire 220A is not particularly limited, and may be formed with one of various conductive materials used in other components/parts of the display unit 230A. For instance, the wire 220A (i.e., the plurality of first wire patterns 221A and at least one second wire pattern 222A) may be formed of one of various materials used to manufacture the display unit 130A, such as molybdenum (Mo), chromium (Cr), titanium (Ti), nickel (Ni), neodymium (Nd), copper (Cu), and an alloy of silver (Ag) with magnesium (Mg). Also, the wire 220A (i.e., the first wire patterns 221A and the second wire pattern 222A) may be formed in a multi-layer structure including the various conductive materials as described above. For example, the wire 220A may be formed in a three-layer structure of titanium (Ti), aluminum (Al), and titanium (Ti), but the present invention is not limited thereto. It is sufficient that the first and second wire patterns are formed of conductive material.

The wire 220A includes a plurality of first wire patterns 221A formed on at least a part of the non-display area NA of the flexible substrate 210A, a second wire pattern 222A formed on at least a part of the non-display area NA of the flexible substrate 210A and electrically connected with the plurality of first wire patterns 221A, and a third wire pattern 223A formed on the display area DA of the flexible substrate 210A and coming in contact with the plurality of first wire patterns 221A or the second wire pattern 222A. For the sake of convenience of description, FIG. 2A shows that the entire non-display area NA of the flexible substrate 210A corresponds to the bending area. Accordingly, the plurality of first wire patterns 221A and the second wire pattern 222A which are formed on the entire non-display area NA of the flexible substrate 210A will be described hereinafter.

The third wire pattern 223A refers to a pattern formed on the display area DA of the flexible substrate 210A in the wire 220A. Here, one end of the third wire pattern 223A is electrically connected with the display unit 230A, and the other end of the third wire pattern 223A comes in contact with the plurality of first wire patterns 221A or the second wire pattern 222A. For the sake of convenience of description, FIG. 2A shows that the other end of the third wire pattern 223A comes in contact with the second wire pattern 222A, but the present invention is not limited thereto. For example, the other end of the third wire pattern 223A may also come in contact with the first wire pattern 221A. The third wire pattern 223A may be formed of a conductive material. In some exemplary embodiments, the third wire pattern 223A may be formed of the same material as one of the conductive materials used to form the display unit 230A. Hereinafter, constituent materials of the third wire pattern 223A will be described later in further detail.

A plurality of first wire patterns 221A are formed on the non-display area NA of the flexible substrate 210A. The plurality of first wire patterns 221A is discontinuously formed on the flexible substrate 210A, and is in the form of an island. The plurality of first wire patterns 221A may be formed of the same material at the same time. The first wire patterns 221A may be formed of a conductive material. In some exemplary embodiments, the first wire patterns 221A may be formed of the same material as one of the conductive materials used to form the display unit 230A. Hereinafter, constituent materials of the first wire pattern 221A will be described later in further detail.

The second wire pattern 222A is formed on the first wire patterns 221A at the non-display area NA of the flexible substrate 210A, and electrically connected with the first wire patterns 221A. As shown in FIG. 2A, when the second wire pattern 222A is in the form of a plurality of wire patterns, the second wire pattern 222A may be in the form of an island. The second wire pattern 222A in the form of an island may be formed on parts of surfaces of the plurality of first wire patterns 221A so that the parts of surfaces of the plurality of first wire patterns 221A can come in contact with a part of a surface of the second wire pattern 222A. Therefore, each of the plurality of second wire patterns 222A may come in contact with two first wire patterns 221A of the plurality of first wire patterns 221A. The plurality of second wire patterns 222A may be formed of the same material at the same time, and may be formed of the same material at the same time as the third wire pattern 223A coming in contact with the plurality of second wire patterns 222A. In this case, among the plurality of second wire patterns 222A, the second wire patterns 222A coming in contact with the third wire pattern 223A may be formed integrally with the third wire pattern 223A. The second wire patterns 222A may be formed of a conductive material. In some exemplary embodiments, the second wire patterns 222A may be formed of the same material as one of the conductive materials used to form the display unit 230A. Hereinafter, constituent materials of the second wire patterns 222A will be described later in further detail.

In general, as the wires formed on the bending area at the flexible substrate increases in length, a greater tensile force is applied to the wires. Therefore, when a wire for connecting two points is formed in a plurality of wire patterns, the intensity of a tensile force applied to the wires may be reduced, compared with when the wire for connecting two points is formed in one wire pattern. Accordingly, in the flexible organic light emitting display device 200A according to still one exemplary embodiment of the present invention, the plurality of first wire patterns 221A and the second wire pattern 222A configured to electrically connect the plurality of first wire patterns 221A may be formed on the bending area at the non-display area NA of the flexible substrate 210A so as to decrease a tensile force applied to the wire 220A and reduce a risk of breaking the wire 220A.

The display unit 230A is disposed on all or part of the display area DA of the flexible substrate 210A. The display unit 230A is an element configured to actually display an image, and may also be referred to as an image display unit or a display panel. The display unit 230A includes an organic light emitting diode 250A and a thin film transistor 240A.

A buffer layer 261A is formed on the flexible substrate 210A. The buffer layer 261A may serve to prevent penetration of moisture or impurities through the flexible substrate 210A and planarize a surface of the flexible substrate 210A. However, the buffer layer 261A is not an essentially required configuration, and may be selected according to the kind of the flexible substrate 210A or the kind of the thin film transistor 240A used in the flexible organic light emitting display device 200A. When the buffer layer 261A is used as shown in FIG. 2A, the buffer layer 261A may be formed of a silicon oxide film, a silicon nitride film, or a multilayer film thereof.

The silicon oxide film and the silicon nitride film constituting the buffer layer 261A have poorer flexibility than a metal. Therefore, in the flexible organic light emitting display device according to another exemplary embodiment of the present invention, the buffer layer 261A may be formed only on the display area DA of the flexible substrate 210A so as to ensure the flexibility of the non-display area NA of the flexible substrate 210A. However, when the buffer layer 261A is formed only on the display area DA of the flexible substrate 210A and is not formed on the non-display area NA of the flexible substrate 210A, the elements positioned on an upper portion of the non-display area NA of the flexible substrate 210A may be susceptible to moisture and oxygen penetrating from a lower portion of the non-display area NA of the flexible substrate 210A. Therefore, as shown in FIG. 2C, the buffer layer 261A formed on the non-display area NA of the flexible substrate 210A may be smaller in thickness than the buffer layer 261A formed on the display area DA of the flexible substrate 210A. In this case, the buffer layer 261A may be formed on the display area DA and the non-display area NA of the flexible substrate 210A to have the same thickness, and the buffer layer 261A having a relatively smaller thickness may then be formed by etching a part of the buffer layer 261A formed on the non-display area NA of the flexible substrate 210A.

Also, the silicon oxide film constituting the buffer layer 261A has poorer flexibility than a metal, but exhibits more excellent flexibility than the silicon nitride film. Therefore, in the flexible organic light emitting display device according to another exemplary embodiment of the present invention, among the materials constituting the buffer layer 261A, only the silicon oxide film may be formed on the non-display area NA of the flexible substrate 210A so as to protect the elements positioned on the non-display area NA of the flexible substrate 210A from moisture and oxygen penetrating from a lower portion of the non-display area NA of the flexible substrate 210A.

An active layer 241A is formed on the flexible substrate 210A. When the buffer layer 261A is not formed, the active layer 241A may be directly formed on the flexible substrate 210A. The active layer 241A may include a channel region configured to form a channel, a source region, and a drain region. Here, the source region and the drain region come in contact with a source electrode 243A and a drain electrode 244A, respectively.

The active layer 241A may include an oxide semiconductor. As a constituent material of the oxide semiconductor included in the active layer 241A, a quaternary metal oxide such as an indium tin gallium zinc oxide (InSnGaZnO)-based material, a ternary metal oxide such as an indium gallium zinc oxide (InGaZnO)-based material, an indium tin zinc oxide (InSnZnO)-based material, an indium aluminum zinc oxide (InAlZnO)-based material, a tin gallium zinc oxide (SnGaZnO)-based material, an aluminum gallium zinc oxide (AlGaZnO)-based material, or a tin aluminum zinc oxide (SnAlZnO)-based material, or a binary metal oxide such as an indium zinc oxide (InZnO)-based material, a tin zinc oxide (SnZnO)-based material, an aluminum zinc oxide (AlZnO)-based material, a zinc magnesium oxide (ZnMgO)-based material, a tin magnesium oxide (SnMgO)-based material, an indium magnesium oxide (InMgO)-based material, an indium gallium oxide (InGaO)-based material, an indium oxide (InO)-based material, a tin oxide (SnO)-based material, or a zinc oxide (ZnO)-based material may be used. Composition ratios of elements included in the above-described material of the oxide semiconductor are not particularly limited and may be adjusted to a wide extent. For the sake of convenience of description, the active layer 241A including the oxide semiconductor has been described in this specification, but the present invention is not limited thereto.

A gate insulation layer 245A is formed on the active layer 241A. The gate insulation layer 245A serves to insulate the active layer 241A from a gate electrode 242A. The gate insulation layer 245A may be formed of a silicon oxide film, a silicon nitride film, or a multilayer film thereof, but the present invention is not limited thereto. For example, the gate insulation layer 245A may be formed of various materials. The gate insulation layer 245A may be formed on an entire front surface of the flexible substrate 210A including the active layer 241A. However, the gate insulation layer 245A may be formed only on the active layer 241A since the gate insulation layer 245A serves only to insulate the active layer 241A from the gate electrode 242A. Also, the gate insulation layer 245A may be formed on an entire front surface of the flexible substrate 210A. As shown in FIG. 2A, the gate insulation layer 245A may also be formed only on the display area DA of the flexible substrate 210A. In this case, the gate insulation layer 245A may be formed to have a contact hole configured to open a part of the active layer 241A, and the contact hole may serve to open parts of source and drain regions of the active layer 241A.

The silicon oxide film constituting the gate insulation layer 245A has poorer flexibility than a metal, but exhibits more excellent flexibility than the silicon nitride film. Therefore, in the flexible organic light emitting display device according to still another exemplary embodiment of the present invention, among the materials constituting the buffer layer 261A, only the silicon oxide film may be formed on the non-display area NA of the flexible substrate 210A so as to protect the elements positioned on an upper portion of the non-display area NA of the flexible substrate 210A from moisture and oxygen penetrating from a lower portion of the non-display area NA of the flexible substrate 210A.

The gate electrode 242A is formed on the gate insulation layer 245A. The gate electrode 242A overlaps at least a part of the active layer 241A, particularly, a channel region of the active layer 241A. The gate electrode 242A may be formed of at least one selected from the group consisting of molybdenum (Mo), aluminum (Al), chromium (Cr), gold (Au), titanium (Ti), nickel (Ni), neodymium (Nd), copper (Cu), and an alloy thereof, but the present invention is not limited thereto. For example, the gate electrode 242A may be formed of various materials. Also, the gate electrode 242A may be composed of multiple layers formed of at least one selected from the group consisting of molybdenum (Mo), aluminum (Al), chromium (Cr), gold (Au), titanium (Ti), nickel (Ni), neodymium (Nd), copper (Cu), and an alloy thereof.

An interlayer insulation film 246A is formed on the gate electrode 242A. The interlayer insulation film 246A may be formed of the same material as the gate insulation layer 245A, and may be formed of a silicon oxide film, silicon nitride film, or a multilayer film thereof, but the present invention is not limited thereto. For example, the interlayer insulation film 246A may be formed of various materials. The interlayer insulation film 246A may be formed to have a contact hole configured to open a part of the active layer 241A, and the contact hole may serve to open parts of source and drain regions of the active layer 241A. The interlayer insulation film 246A may be formed only on the display area DA of the flexible substrate 210A as shown in FIG. 2A, but may also be formed on both the display area DA and the non-display area NA of the flexible substrate 210A like the buffer layer 261A and the gate insulation layer 245A. Among the materials constituting the interlayer insulation film 246A, only the material having excellent flexibility, such as a silicon oxide film, may be formed on the non-display area NA of the flexible substrate 210A.

The source electrode 243A and the drain electrode 244A are formed on the interlayer insulation film 246A. The source electrode 243A and the drain electrode 244A may be electrically connected respectively to the source and drain regions of the active layer 241A through the contact hole formed in the interlayer insulation film 246A and/or gate insulation layer 245A. The source electrode 243A and the drain electrode 244A may be formed of at least one selected from the group consisting of molybdenum (Mo), aluminum (Al), chromium (Cr), gold (Au), titanium (Ti), nickel (Ni), neodymium (Nd), copper (Cu), and an alloy thereof, but the present invention is not limited thereto. For example, the source electrode 243A and the drain electrode 244A may be formed of various materials. Also, the source electrode 243A and the drain electrode 244A may be composed of multiple layers formed of at least one selected from the group consisting of molybdenum (Mo), aluminum (Al), chromium (Cr), gold (Au), titanium (Ti), nickel (Ni), neodymium (Nd), copper (Cu), and an alloy thereof.

A passivation film 262A is formed on the source electrode 243A and the drain electrode 244A. The passivation film 262A may be formed to have a contact hole configured to expose the source electrode 243A or the drain electrode 244A. The passivation film 262A is a protective layer that may be formed of the same material as the interlayer insulation film 246A and/or the gate insulation layer 245A, and may be composed of a single layer or multiple layers formed of at least one selected from the group consisting of a silicon oxide film and a silicon nitride film, but the present invention is not limited thereto. For example, the passivation film 262A may be formed of various materials. FIG. 2A shows that the flexible organic light emitting display device 200A includes the passivation film 262A, but it is possible to exclude the passivation film 262A since the passivation film 262A is not an essentially required configuration. The passivation film 262A may be formed on both the display area DA and the non-display area NA of the flexible substrate 210A as shown in FIG. 2A, and also be formed on the wires 220A to protect the wires 220A from the outside.

An overcoat layer 264A may be formed on the source electrode 243A and the drain electrode 244A. The overcoat layer 264A may also be referred to as a planarization film. When the passivation film 262A is formed, the overcoat layer 264A may be formed on the passivation film 262A. The overcoat layer 264A serves to planarize an upper surface of the flexible substrate 210A. Also, the overcoat layer 264A may be formed to have a contact hole configured to expose the source electrode 243A or the drain electrode 244A. The overcoat layer 264A may be formed of at least one material selected from the group consisting of an acrylic resin, an epoxy resin, a phenolic resin, a polyamide-based resin, a polyimide-based resin, an unsaturated polyester-based resin, a polyphenylene-based resin, a polyphenylene-sulfide-based resin, and benzocyclobutene, but the present invention is not limited thereto. For example, the overcoat layer 264A may be formed of various materials.

The thin film transistor 240A includes the active layer 241A, the gate insulation layer 245A, the gate electrode 242A, the interlayer insulation film 246A, the source electrode 243A, and the drain electrode 244A, all of which are formed as described above. The thin film transistor 240A may be formed on every pixel or sub-pixel region of the display area DA of the flexible substrate 210A, and each pixel or sub-pixel region may be independently driven. A configuration of the thin film transistor 240A is not limited to the exemplary embodiments as described above, and may be widely modified and changed into the known configurations which may be readily practiced by those skilled in the related art.

The thin film transistor 240A may be formed on the flexible substrate 210A to allow an organic light emitting layer 254A of the organic light emitting diode 250A to emit light. In general, a switching thin film transistor and a driving thin film transistor are used to allow the organic light emitting layer 254A to emit light using image information of an input data signal according to a scan signal.

The switching thin film transistor serves to send a data signal from a data wire to a gate electrode of the driving thin film transistor when a scan signal is applied from a gate wire. The driving thin film transistor serves to send an electric current, which is transmitted through a power wire by the data signal received from the switching thin film transistor, to an anode, and control light emission of the organic light emitting layer of the corresponding pixels or sub-pixels by the electric current transmitted to the anode.

The flexible organic light emitting display device 200A may further include a thin film transistor for compensation circuits, which is designed to prevent abnormal driving of the flexible organic light emitting display device 200A.

In this specification, among various thin film transistors that may be included in the flexible organic light emitting display device 200A, only the driving thin film transistor 240A is shown for the sake of convenience of description.

Structures of the thin film transistor may be classified into an inverted-staggered structure and a coplanar structure according to positions of the elements constituting the thin film transistor. The thin film transistor having an inverted-staggered structure refers to a thin film transistor having a structure in which a gate electrode is positioned opposite to a source electrode and a drain electrode based on an active layer, and the thin film transistor having a coplanar structure refers to a thin film transistor having a structure in which a gate electrode is positioned on the same plane as a source electrode and a drain electrode based on an active layer. In this specification, the thin film transistor 240A having a coplanar structure is shown for the sake of convenience of description, but the present invention is not limited thereto. For example, the thin film transistor having an inverted-staggered structure may also be used herein.

The organic light emitting diode 250A including an anode 251A, the organic light emitting layer 254A, and a cathode 255A is formed on the flexible substrate 210A. The organic light emitting diode 250A is driven to form an image on a principle that holes provided in the anode 251A and electrons provided in the cathode 255A are combined at the organic light emitting layer 254A to emit light.

The flexible organic light emitting display device 200A is an independent drive display device which is driven per each sub-pixel region of the display area DA. Therefore, the thin film transistor 240A and the organic light emitting diode 250A as described above may be disposed on each sub-pixel region of the display area DA to allow the thin film transistor 240A disposed on each sub-pixel region to independently drive the organic light emitting diode 250A.

The anode 251A is formed on the overcoat layer 264A. The anode 251A may also be referred to as a positive pole, a pixel electrode, or a first electrode. The anode 251A may be formed separately on each sub-pixel region of the display area DA. The anode 251A may be connected to the source electrode 243A of the thin film transistor 240A via the contact hole formed in the overcoat layer 264A. In this specification, under the assumption that the thin film transistor 240A is an N-type thin film transistor, it is described that the anode 251A is connected to the source electrode 243A. However, when the thin film transistor 240A is a P-type thin film transistor, the anode 251A may also be connected to the drain electrode 244A. The anode 251A may come in direct contact with the organic light emitting layer 254A, or may be in contact and electrically connected to the organic light emitting layer 254A with a conductive material positioned therebetween.

The anode 251A is formed of a conductive material having a high work function since the anode 251A should provide holes. The anode 251A may include a transparent conductive layer 253A having a high work function, and the transparent conductive layer 253A may be formed of a transparent conductive oxide (TCO), for example, indium tin oxide (ITO), indium zinc oxide (IZO), indium tin zinc oxide (ITZO), zinc oxide, or tin oxide.

As shown in FIG. 2C, when the flexible organic light emitting display device 200A is an organic light emitting display device with a top emission mode, the anode 251A includes a reflective layer 252A formed under the transparent conductive layer 253A. The organic light emitting layer 254A emits light in all directions. However, in the case of the organic light emitting display device with a top emission mode, light emitted from the organic light emitting layer 254A should be radiated from an upper portion of the organic light emitting display device. However, when the anode 251A is composed only of the transparent conductive layer 253A as described above, the light emitted from the organic light emitting layer 254A toward the anode 251A is reflected upward on the other elements positioned below the anode 251A, but may be lost as the light radiates downward to the flexible substrate 210A. In this case, optical efficiency of the organic light emitting display device may be lowered. Therefore, the anode 251A may include a separate low-resistive reflective layer 252A so as to radiate the light emitted from the organic light emitting layer 254A toward the anode 251A from an upper portion of the organic light emitting display device. The reflective layer 252A may be formed of a conductive layer having excellent reflexibility, for example, silver (Ag), nickel (Ni), gold (Au), platinum (Pt), aluminum (Al), copper (Cu), or molybdenum/aluminum neodymium (Mo/AlNd).

In this specification, it is defined that the anode 251A includes the transparent conductive layer 253A and the reflective layer 252A, but it may also be defined that the anode 251A is composed only of the transparent conductive layer 253A and the reflective layer 252A has a separate configuration. In this specification, it is also described that the anode 251A is composed of a reflective metal layer and a transparent conductive material having a high work function. However, the anode 251A itself may be formed of a conductive material having a high work function and exhibiting excellent reflexibility. Although not shown in FIG. 2A, when the flexible organic light emitting display device 200A is an organic light emitting display device with a bottom emission mode, the anode 251A may be formed of only a transparent conductive material having a high work function, or may also be formed of the transparent conductive material having a high work function together with a semi-transmissive metal layer positioned under the transparent conductive material so as to embody microcavities.

Among the transparent conductive layer 253A and the reflective layer 252A, both of which constitute the anode 251A, the transparent conductive layer 253A may be electrically connected to the source electrode 243A. Referring to FIG. 2A, the reflective layer 252A is formed on the overcoat layer 264A, and a contact hole is formed in the overcoat layer 264A to electrically connect the transparent conductive layer 253A with the drain electrode 244A. For the sake of convenience of description, FIG. 2A shows that the transparent conductive layer 253A is electrically connected to the source electrode 243A. However, the reflective layer 252A may be electrically connected to the source electrode 243A via the contact hole formed in the overcoat layer 264A, and the transparent conductive layer 253A may be formed on the reflective layer 252A to be electrically connected to the source electrode 243A through the reflective layer 252A.

A bank layer 265A is formed on the anode 251A and the overcoat layer 264A. The bank layer 265A serves to distinguish adjacent sub-pixel regions from each other so that the bank layer 265A can be disposed between the adjacent sub-pixel regions. Also, the bank layer 265A may be formed to open a part of the anode 251A. The bank layer 265A may be formed of an organic insulation material, for example, one material selected from the group consisting of polyimide, photoacryl, and benzocyclobutene (BCB). The bank layer 265A may be formed in a tapered shape. When the bank layer 265A is formed in a tapered shape, the bank layer 265A may be formed using a positive-type photoresist. The bank layer 265A may be formed with a predetermined thickness so as to distinguish the adjacent sub-pixel regions from each other.

As a method of displaying an image, the flexible organic light emitting display device 200A uses a method of forming an organic light emitting layer that autonomously emits red, green, and blue lights on every sub-pixel region, and a method of forming an organic light emitting layer emitting a white light on all sub-pixel regions and simultaneously applying color filters. In the case of the organic light emitting display device manufactured using the organic light emitting layer autonomously emitting the red, green, and blue lights from each of the sub-pixel regions, an organic light emitting layer emitting one of red, green, and blue lights may be formed on the anode formed on each of a red sub-pixel region, a green sub-pixel region, and a blue sub-pixel region, all of which are opened by the bank layer. Also, the organic light emitting layers formed on the red sub-pixel region, the green sub-pixel region, and the blue sub-pixel region may be separated. In the case of the organic light emitting display device manufactured using the white organic light emitting layer and the color filter, a white organic light emitting layer may be formed on the anode formed on each of the red sub-pixel region, the green sub-pixel region, and the blue sub-pixel region, all of which are opened by the bank layer. The organic light emitting layers formed on the red sub-pixel region, the green sub-pixel region, and the blue sub-pixel region may be connected to or separated from each other. For the sake of convenience of description, the flexible organic light emitting display device 200A manufactured using the organic light emitting layer 254A autonomously emitting the red, green, and blue lights from each of the sub-pixel regions is shown in FIG. 2A. It is also shown that the organic light emitting layers 254A of the respective sub-pixel regions are not connected to each other, but the present invention is not limited thereto.

The cathode 255A is formed on the organic light emitting layer 254A. The cathode 255A may also be referred to as a negative pole, a common electrode, or a second electrode. The cathode 255A may be connected to a separate voltage wire 220A to apply the same level of voltage to all the sub-pixel regions of the display area DA.

Since the cathode 255A should provide electrons, the cathode 255A is formed of a material having high electric conductivity and a low work function, that is, a material for cathodes. Specific materials constituting the cathode 255A may be differently selected according to an emission mode of the organic light emitting display device. As shown in FIG. 2A, when the flexible organic light emitting display device 200A is an organic light emitting display device with a top emission mode, the cathode 255A may be formed of a metallic material having a very small thickness and a low work function. For example, when the cathode 255A is formed of a metallic material having a low work function, a metallic material such as silver (Ag), titanium (Ti), aluminum (Al), molybdenum (Mo), or an alloy of silver (Ag) with magnesium (Mg) may be formed into a thin film having a thickness of several hundreds of Å or less, for example, 200 Å or less so as to form the cathode 255A. In this case, the cathode 255A becomes a substantially semi-transmissive layer and then is used as a substantially transparent cathode. Although a material constituting the cathode 255A is a metal which is opaque and has a high reflection coefficient, the cathode 255A has such a thickness that the cathode 255A can become transparent at a certain point of time as the cathode 255A gets thinner to a thickness equal to or less than a predetermined thickness (for example, 200 Å). The cathode 255A having such a thickness may be referred to as a substantially transparent cathode. Also, carbon nanotube and graphene coming into the spotlight as new materials may also be used as the material for cathodes.

As a sealing member covering the organic light emitting diode 250A, an encapsulation unit 270A is formed on the organic light emitting diode 250A including the cathode 255A. The encapsulation unit 270A may serve to protect internal elements, such as a thin film transistor 240A and an organic light emitting diode 250A, of the flexible organic light emitting display device 200A from moisture, air, and impact provided from the outside. The encapsulation unit 270A may be formed on a display area DA of the flexible organic light emitting display device 200A to protect the internal elements of the flexible organic light emitting display device 200A.

The encapsulation unit 270A may have various configurations according to a method of sealing the internal elements, such as a thin film transistor 240A and an organic light emitting diode 250A, of the flexible organic light emitting display device 200A. For example, the method of sealing the flexible organic light emitting display device 200A includes methods such as metal can encapsulation, glass can encapsulation, thin film encapsulation (TFE), and face sealing.

A pad portion 266A is formed on the flexible substrate 210A. The pad portion 266A may be formed on the display area DA of the flexible substrate 210A. For the sake of convenience of description, FIG. 2A shows that the pad portion 266A is formed on the gate insulation layer 245A in the display area DA of the flexible substrate 210A, but the present invention is not limited thereto. For example, the pad portion 266A may be formed on the flexible substrate 210A or the buffer layer 261A.

The pad portion 266A shown in FIG. 2A is configured to connect the gate wire 220A with a gate driver IC configured to apply a gate signal to the gate wire 220A, and is formed on the same plane as the gate electrode 242A and made of the same material as the gate electrode 242A. When the pad portion 266A is configured to connect the data wire 220A with the data driver IC configured to apply the data signal to the data wire 220A, the pad portion 266A may be formed on the same plane as the source electrode 243A and the drain electrode 244A and made of the same material as that of the source electrode 243A and the drain electrode 244A.

The wires 220A may electrically connect the pad portion 266A formed on the display area DA of the flexible substrate 210A with a drive circuit unit, a gate driver IC, or a data driver IC to send a signal. A plurality of first wire patterns 221A may be formed of the same material as one of the gate electrode 242A, the source electrode 243A, the drain electrode 244A, and the reflective layer 252A, and the second wire pattern 222A may be formed of the same material as the other one of the source electrode 243A, the drain electrode 244A, the reflective layer 252A and the cathode 255A, which is different from the material of the first wire pattern 221A. Here, a case in which the second wire pattern 222A is formed of the same material as "the other one" of the source electrode 243A, the drain electrode 244A, the reflective layer 252A, and the cathode 255A encompasses that the second wire pattern 222A is formed of the same material as an element different from another element of the display unit 230A formed of the same material as the plurality of first wire patterns 221A. Since the second wire pattern 222A is formed on the plurality of first wire patterns 221A in the non-display area NA of the flexible substrate 210A, the plurality of first wire patterns 221A is first formed, and the second wire pattern 222A is then formed according to the sequence of manufacturing processes. Therefore, since the element of the display unit 230A formed of the same material as the second wire pattern 222A is formed on the element of the display unit 230A formed of the same material as the plurality of first wire patterns 221A, the element of the display unit 230A formed of the same material as the second wire pattern 222A is formed on the element of the display unit 230A formed of the same material as the plurality of first wire patterns 221A according to the sequence of manufacturing processes.

FIG. 2A shows that the plurality of first wire patterns 221A are formed of the same material as the gate electrode 242A, and the second wire pattern 222A is formed of the same material as the source electrode 243A and the drain electrode 244A, but the present invention is not limited thereto. For example, the second wire pattern 222A may be formed of the same material as the reflective layer 252A or the cathode 255A having a configuration different from the configuration of the display unit 230A formed of the same material as the first wire pattern 221A.

The first wire pattern 221A may be formed of a metal which is not etched upon etching an inorganic film. In the manufacture of the flexible organic light emitting display device 200A, the first wire pattern 221A formed of the same material as the gate electrode 242A may be formed on the flexible substrate 210A, the interlayer insulation film 246A may be formed on a front surface of the flexible substrate 210A, and the interlayer insulation film 246A formed on the first wire pattern 221A in which it is unnecessary to dispose the interlayer insulation film 246A may be etched. In general, since the interlayer insulation film 246A includes an inorganic film, an etchant is used to etch the inorganic film upon etching the interlayer insulation film 246A. In this case, when the first wire pattern 221A is etched by an etchant for etching an inorganic film, the first wire pattern 221A may be damaged. In this regard, the first wire pattern 221A may be formed of a metal which is not etched upon etching an inorganic film.

The third wire pattern 223A may come in contact with the second wire pattern 222A, and may be formed integrally with the second wire pattern 222A. Therefore, the third wire pattern 223A may be formed of the same material as the second wire pattern 222A.

FIG. 2A shows that the flexible organic light emitting display device 200A is an organic light emitting display device with a top emission mode. However, when the flexible organic light emitting display device 200A is an organic light emitting display device with a bottom emission mode, the plurality of first wire patterns 221A may be formed of the same material as one of the gate electrode 242A, the source electrode 243A, the drain electrode 244A, and the semi-transmissive metal layer, and the second wire pattern 222A may be formed of the same material as the other one of the source electrode 243A, the drain electrode 244A, the semi-transmissive metal layer, and the cathode 255A, which is different from the material of the plurality of first wire patterns 221A.

In some exemplary embodiments, a separation layer may be formed between the plurality of first wire patterns 221A and the second wire pattern 222A. The separation layer may be formed of an insulation material, and may also be formed of the same material as one of the insulation material used to form the display unit 230A. For example, when the plurality of first wire patterns 221A is formed of the same material as the gate electrode 242A, and the second wire pattern 222A is formed of the same material as the source electrode 243A and the drain electrode 244A, as shown in FIG. 2A, the separation layer may be formed of an insulation material formed between the gate electrode 242A and the source electrode 243A and drain electrode 244A in the display unit 230A, and may also be formed of the same material as one of the gate insulation layer 245A and the interlayer insulation film 246A. When the separation layer is formed, the separation layer may include a contact hole configured to open a part of the first wire pattern 221A, and the second wire pattern 222A may be formed on the separation layer to come in contact with the plurality of first wire patterns 221A through the contact hole formed in the separation layer.

Figure 2B:
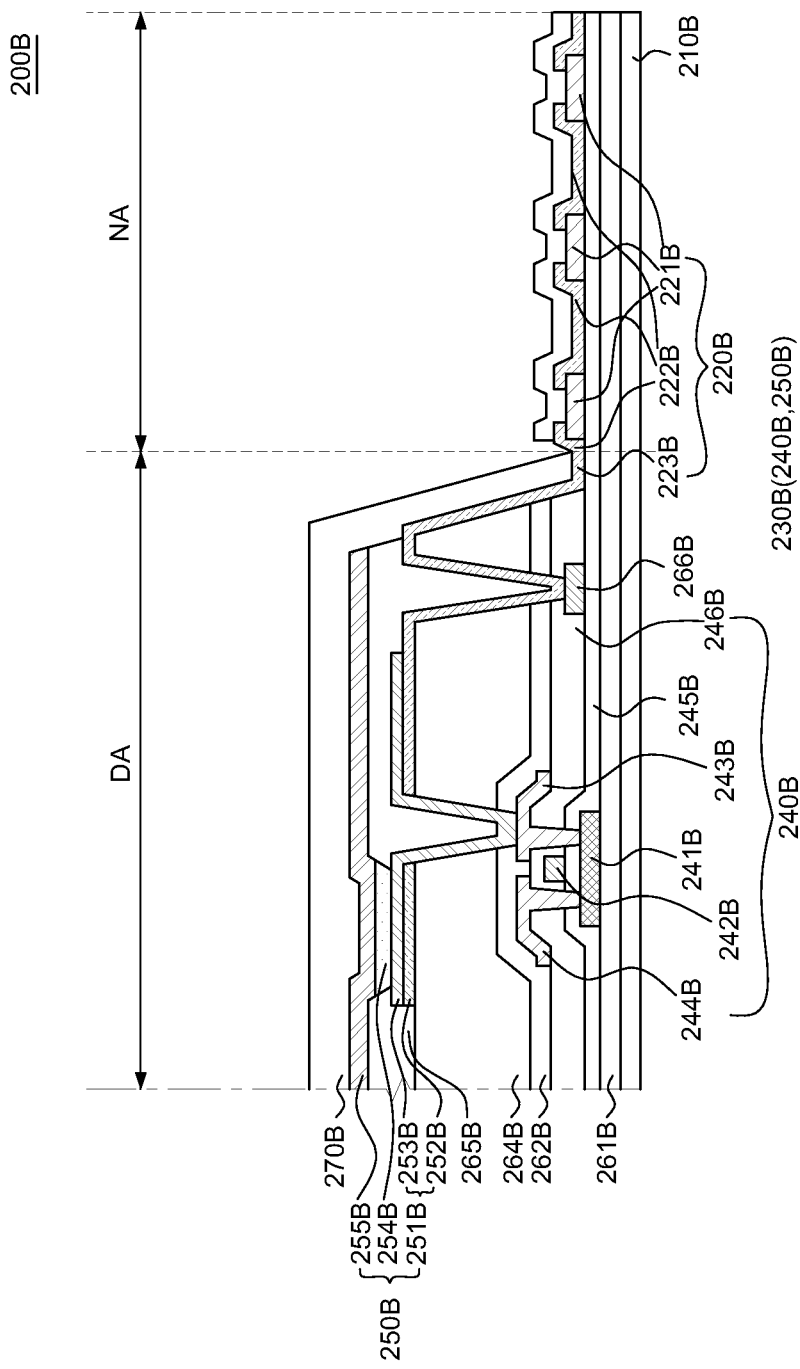
Figure 2C:
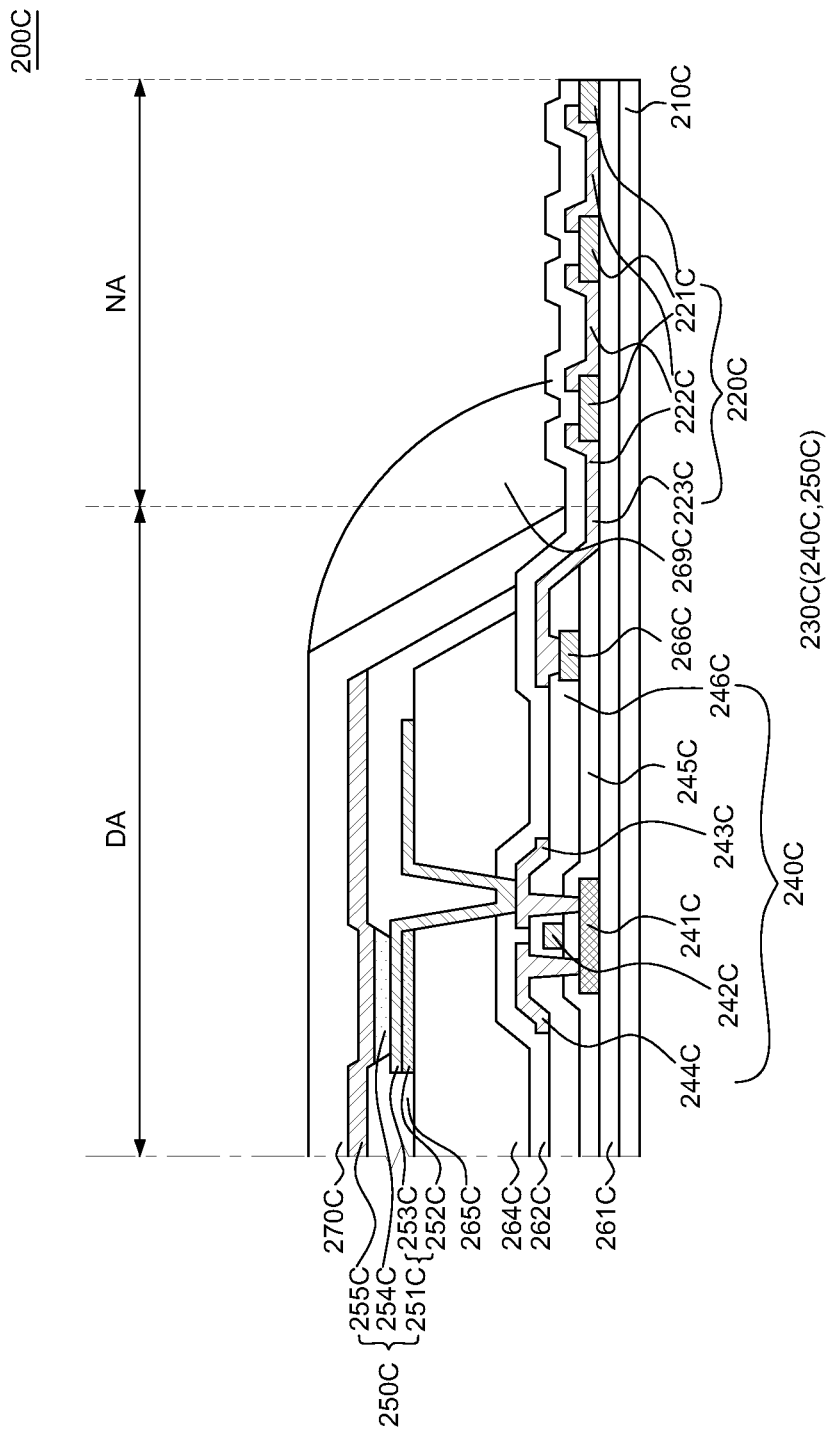

FIG. 2B is a cross-sectional view showing an unbent state of the flexible organic light emitting display device according to another exemplary embodiment of the present invention. Referring to FIG. 2B, a flexible organic light emitting display device 200B includes a flexible substrate 210B, a wire 220B, and a display unit 230B. The flexible substrate 210B and the display unit 230B are substantially identical to the flexible substrate 210A and the display unit 230A shown in FIG. 2A, and thus repeated description of the flexible substrate 210B and the display unit 230B is omitted for brevity.

A plurality of first wire patterns 221B may be formed of the same material as one of a gate electrode 242B, a source electrode 243B, a drain electrode 244B, and a reflective layer 252B, and a second wire pattern 222B may be formed of the same material as the other one of the source electrode 243B, the drain electrode 244B, the reflective layer 252B, and the cathode 255B, which is different from the material of the plurality of first wire patterns 221B. FIG. 2B shows that the plurality of first wire patterns 221B are formed of the same material as the source electrode 243B and the drain electrode 244B, and the second wire pattern 222B is formed of the same material as the reflective layer 252B, but the present invention is not limited thereto. For example, the second wire pattern 222B may be formed of the same material as the cathode 255B. In some exemplary embodiments, the plurality of first wire patterns 221B may also be formed of the same material as the reflective layer 252B, and the second wire pattern 222B may be formed of the same material as the cathode 255B. The third wire pattern 223B may come in contact with the second wire pattern 222B, and may be formed integrally with the second wire pattern 222B. Therefore, the third wire pattern 223B may be formed of the same material as the second wire pattern 222B. The wire 220B is substantially identical to the wire 220A shown in FIG. 2A except for the constituent materials of the wire 220B, and thus repeated description of the wire 220B is omitted for brevity.

FIG. 2C is a cross-sectional view showing an unbent state of the flexible organic light emitting display device according to still another exemplary embodiment of the present invention. Referring to FIG. 2C, a flexible organic light emitting display device 200C includes a flexible substrate 210C, a wire 220C, a display unit 230C, and an organic film 269C. The flexible substrate 210C, the wire 220C, and the display unit 230C are substantially identical to the flexible substrate 210A, the wire 220A, and the display unit 230A shown in FIG. 2A, and thus repeated description of the flexible substrate 210C, the wire 220C, and the display unit 230C is omitted for brevity.

The organic film 269C may be formed on the wire 220C. When the flexible substrate 210C is bent, a tensile force is applied to the wire 220C formed on the flexible substrate 210C. Accordingly, in the flexible organic light emitting display device 200C according to still another exemplary embodiment of the present invention, the organic film 269C is formed on the wire 220C of the flexible substrate 210C. When the flexible substrate 210C on which the organic film 269C is further formed is bent, a tensile force from the flexible substrate 210C, and a compressive force from the organic film 269C are simultaneously applied to the wire 220C formed on the flexible substrate 210C so that the tensile force and the compressive force can be offset, and the stress applied to the wire 220C may be minimized to be protected from impact according to bending of the flexible organic light emitting display device 200C. Here, to offset the tensile force and the compressive force applied to the wire 220C, the organic film 269C may have the same thickness as the flexible substrate 210C, or the organic film 269C may have a greater thickness than the flexible substrate 210C.

As shown in FIG. 2C, the organic film 269C may be formed around the boundary between the display area DA and the non-display area NA of the flexible substrate 210C, that is, formed only at an area in which the flexible substrate 210C is bent, but the present invention is not limited thereto. For example, the organic film 269C may be formed on the entire non-display area NA of the flexible substrate 210C.

Figure 2D:
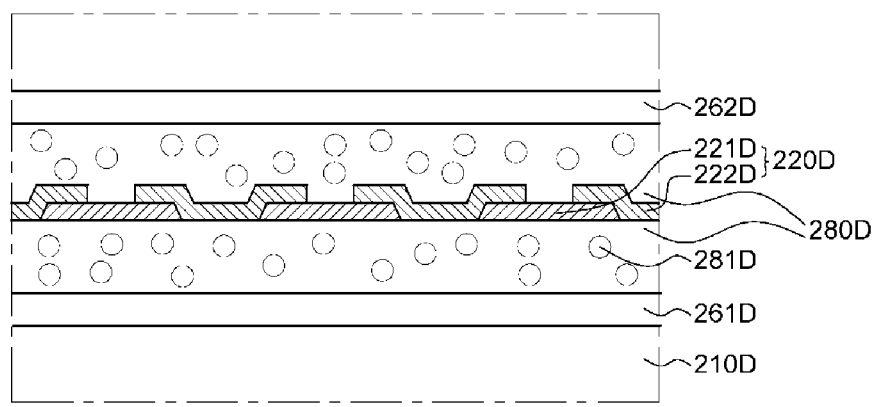
FIG. 2D is an enlarged diagram of an area X shown in FIG. 2A according to an embodiment of the present invention.

FIG. 2D is an enlarged diagram of an area X shown in FIG. 2A according to another exemplary embodiment of the present invention. Referring to FIG. 2D, a crack prevention layer 280D may be disposed on top and bottom surfaces of a wire 220D. More particularly, the crack prevention layer 280D may be disposed between the wire 220D and a substrate or an insulation layer formed under the wire 220D in the non-display area NA of the flexible substrate 210D, or between the wire 220D and the insulation layer formed under the wire 220D in the non-display area NA of the flexible substrate 210D. For the sake of convenience of description, FIG. 2D shows that a buffer layer 261D is formed as an insulation layer between the wire 220D and the flexible substrate 210D, and a passivation film 262D is formed on a top surface of the wire 220D, but the present invention is not limited thereto. For example, various insulation layers may be formed on the wire 220D. FIG. 2D shows that the prevention layers 280D are disposed on both the top and bottom surfaces of the wire 220D, but the present invention is not limited thereto. For example, the crack prevention layer 280D may also be formed on one of the top and bottom surfaces of the wire 220D.

The crack prevention layer 280D may include a crack preventing material 281D such as a porous material or nanoparticles. The crack prevention layer 280D may have an interlayer structure in which the porous material or nanoparticles are dispersed in a packing layer made of an insulation material. Here, when the crack prevention layer 280D is formed with an interlayer structure including a porous material, the crack prevention layer 280D may be formed with an interlayer structure including a silica gel. On the other hand, when the crack prevention layer 280D is formed with an interlayer structure in which nanoparticles are dispersed, the crack prevention layer 280D may be formed with an interlayer structure including various nanoparticles such as silver (Ag). FIG. 2D shows that the crack prevention layer 280D is formed with an interlayer structure in which the porous material or nanoparticles are dispersed in the packing layer made of the insulation material. However, the crack prevention layer 280D may include only the nanoparticles, and may be formed with a structure in which the nanoparticles are dispersed between the wire 220D and the insulation layer.

When a non-display area of the flexible organic light emitting display device is bent, more cracks are caused at the other elements formed on upper and lower portion of the wire formed of the insulation material, compared with the wire formed of a metal. As a result, the wires may be cracked. Accordingly, in a flexible organic light emitting display device 200D according to still another exemplary embodiment of the present invention, the crack prevention layer 280D including the porous material or nanoparticles may be disposed on the top surface and/or the bottom surface of the wire 220D to allow the crack prevention layer 280D to absorb stress transferred from an upper or lower portion of the crack prevention layer 280D. Also, when the elements positioned on or under the crack prevention layer 280D are cracked, a crack direction is changed to different directions other than a direction perpendicular to the wire 220D to prevent the wire 220D from being cracked by cracks caused at the other elements.

Figure 3:
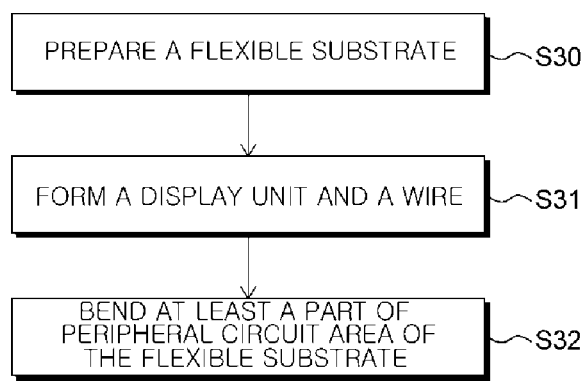
FIG. 3 is a flowchart illustrating a method of manufacturing a flexible organic light emitting display device according to an embodiment of the present invention.

FIG. 3 is a flowchart illustrating a method of manufacturing a flexible organic light emitting display device according to one exemplary embodiment of the present invention.

First, a flexible substrate including a display area and a non-display area is prepared (S30). Preparation of the flexible substrate is substantially identical to preparation of the flexible substrate shown in FIGS. 1A to 2D, and thus repeated description of the preparation of the flexible substrate is omitted for brevity.

Next, a display unit including an organic light emitting diode and a thin film transistor is formed on a display area of the flexible substrate (S31). Formation of the display unit is substantially identical to formation of the display unit shown in FIGS. 1A to 2D, and thus repeated description of the formation of the display unit is omitted for brevity.

In some exemplary embodiments, the forming of the display unit may include forming a wire electrically connected with the display unit on the display area and a non-display area of the flexible substrate. Since the wire is formed of the same material as one of the conductive materials used to form the display unit, the wire may be formed together with a process of forming a display unit. In some exemplary embodiments, the wires positioned on at least a part of the non-display area of the flexible substrate may include a plurality of discontinuously formed first wire patterns, and a second wire pattern formed on the plurality of first wire patterns and electrically connected with the plurality of first wire patterns. In some exemplary embodiments, the wire formed on at least a part of the non-display area of the flexible substrate may include a portion formed in at least one shape selected from the group consisting of a chopping wave shape, a sawtooth wave shape, a square wave shape, a sine wave shape, an omega (Ω) shape, a trapezoidal wave shape, and a lozenge shape, and may also include a wire portion formed in an oblique direction. Formation of the wire is substantially identical to formation of the wire shown in FIGS. 1A to 2D, and thus repeated description of the formation of the wire is omitted for brevity.

Subsequently, at least a part of the non-display area of the flexible substrate is crooked in a bending direction (S32).

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A flexible display substrate comprising:
   a flexible substrate having;
      a display area, and
      a non-display area adjacent to the display area and including a curved portion that is bent: and
      a wire extending from the display area over the curved portion, the wire having a plurality of first wire patterns and at least one second wire pattern in the non-display area: and
   wherein each of the plurality of first wire patterns is spaced apart from an adjacent first wire pattern, wherein the second wire pattern electrically connects at least two of the plurality of first wire patterns.

2. The flexible display substrate of claim 1, wherein the second wire pattern partially overlaps with the at least two of the plurality of first wire patterns.

3. The flexible display substrate of claim 2, wherein each of the at least two of the plurality of first wire patterns overlaps with the second wire pattern and is in physical contact with the second wire pattern.

4. The flexible display substrate of claim 3, further comprising additional second wire patterns, wherein each of the additional second wire patterns electrically connects the first wire patterns.

5. The flexible display substrate of claim 4, wherein the second wire pattern and the additional second wire patterns have different lengths.

6. The flexible display substrate of claim 1, wherein the second wire pattern covers at least one of the plurality of first wire patterns entirely.

7. The flexible display substrate of claim 1, wherein the second wire pattern is in physical contact with all of the plurality of first wire patterns.

8. The flexible display substrate of claim 1, wherein the second wire pattern has greater flexibility than the plurality of first wire patterns.

9. The flexible display substrate of claim 2, wherein two adjacent first wire patterns are spaced apart by a predetermined distance, and the second wire pattern has a length longer the predetermined distance.

10. The flexible display substrate of claim 2, further comprising an insulation layer formed between and formed on each of the plurality of first wire patterns, wherein the second wire pattern is disposed on the insulation layer.

11. The flexible display substrate of claim 2, wherein at least a portion of the wire in the curved portion extends in a direction that is not parallel to a bending direction of the curved portion.

12. The flexible display substrate of claim 2, wherein the second wire pattern comprises a plurality of portions, at least one of the plurality of portions extending in a direction that is not parallel to a bending direction of the curved portion.

13. The flexible display substrate of claim 1, further comprising a third wire pattern on the display area of the flexible substrate, wherein the third wire pattern is electrically connected to the plurality of first wire patterns.

14. The flexible display substrate of claim 1, further comprising a thin film transistor (TFT) on the display area of the flexible substrate to operate a light emitting element based on a signal transmitted via the wire.

15. A flexible display device, comprising:
   a flexible substrate including:
      a display area that is substantially flat along a plane, and
      a non-display area including a bending area adjacent to the display area and bending away from the plane;
   a wire extending from the display area over the bending area of the flexible substrate; and
   a crack prevention layer disposed on at least one of top and bottom surfaces of the wire and including at least one of a porous material and nanoparticles,
   wherein the wire includes a first layer of wire segments and a second layer of wire segments electrically connecting the first layer of wire segments, at least part of the second layer formed on the first layer, and wherein at least one of the first layer of wire segments and the second layer of wire segments are in the form of an island in the bending area so as to reduce or prevent cracks on the wire upon the bending the flexible substrate at the bending area.

16. The flexible display device of claim 15, further comprising:
   a passivation layer formed above the wire at an opposite side of the flexible substrate; and
   wherein the crack prevention layer is disposed between the passivation layer and the wire.

17. The flexible display device of claim 15, further comprises a display unit having an anode, a cathode, an organic light emitting diode between the anode and the cathode, and a plurality of thin-film-transistors (TFT), each TFT having a source electrode, a drain electrode and a gate electrode, wherein the first layer or the second layer is formed of the same material as at least one of the anode, the cathode, the source electrode, the drain electrode and the gate electrode.

18. The flexible display device of claim 17, wherein the wire is connected to at least one of the anode, the cathode, the source electrode, the drain electrode and the gate electrode.

19. The flexible display device of claim 15, further comprising a separation layer interposed between the first layer of wire segments and the second layer of wire segments, the separation layer having a plurality of contact holes, wherein the first layer is in physically contact with the second layer through the plurality of contact holes.

20. The flexible display device of claim 19, further comprises:
- a buffer layer interposed between the wire and the flexible substrate; and
- a crack prevention layer interposed between the buffer layer and the wire.

21. The flexible display device of claim 19, further comprises:
- a passivation film disposed on the wire; and
- a crack prevention layer interposed between the passivation film and the wire.

22. The flexible display device of claim 15, further comprising a third layer of wire segment on the display area, wherein the third layer of wire segment is electrically connected the first layer of wire segments.

23. The flexible display device of claim 17, wherein the plurality of thin film transistor (TFT) on the display area to operate the organic light emitting diode based on a signal transmitted via the wire.

24. A method fabrication a flexible display device, comprising:
- forming a plurality of first wire segments that extend from a display area of a flexible substrate over at least a bending area of a non-display area of the flexible substrate;
- forming a second wire segment bridging the first wire segments in the bending area of the non-display area of the flexible substrate;
- forming a display unit on the display area of a flat area adjacent to the bending area, the display unit having an anode, a cathode, an organic light emitting diode between the anode and the cathode, and a plurality of thin-film-transistors (TFT), each TFT having a source electrode, a drain electrode and a gate electrode, wherein the first wire segments or the second wire segment are formed of the same material as any one of the anode, the cathode, the source electrode, the drain electrod and the gate electrode; and
- bending the flexible substrate at the bending area away from a plane along which the flat area of the flexible substrate extends,
- wherein the first wire segments and the second wire segment are in the form of an island so as to reduce or prevent cracks on the wire upon the bending the flexible substrate at the bending area.

25. The method of claim 24, wherein forming the plurality of first wire segments comprises etching a layer of metal on the flexible substrate.

26. The method of fabricating the flexible display device of claim 24, further comprising forming a third wire segment on the display area electrically connected to the plurality of first wire segments.

27. The method of fabricating the flexible display device of claim 24, wherein the plurality of thin-film-transistors (TFT) are to operate the organic light emitting diode based on a signal transmitted via the plurality of first wire segments and the second wire segment.

* * * * *